(12) United States Patent
Khaderbad et al.

(10) Patent No.: US 12,074,068 B2
(45) Date of Patent: Aug. 27, 2024

(54) EPITAXIAL STRUCTURES FOR STACKED SEMICONDUCTOR DEVICES

(71) Applicant: Taiwan Semiconductor Manufacturing Co., Ltd., Hsinchu (TW)

(72) Inventors: Mrunal Abhijith Khaderbad, Hsinchu (TW); Sathaiya Mahaveer Dhanyakumar, Hsinchu (TW); Huicheng Chang, Tainan (TW); Keng-Chu Lin, Ping-Tung (TW); Winnie Victoria Wei-Ning Chen, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 250 days.

(21) Appl. No.: 17/461,271

(22) Filed: Aug. 30, 2021

(65) Prior Publication Data

US 2023/0068065 A1    Mar. 2, 2023

(51) Int. Cl.
*H01L 21/822* (2006.01)
*H01L 21/8234* (2006.01)
*H01L 27/092* (2006.01)

(52) U.S. Cl.
CPC .. *H01L 21/8221* (2013.01); *H01L 21/823418* (2013.01); *H01L 21/823481* (2013.01); *H01L 27/092* (2013.01)

(58) Field of Classification Search
CPC ......... H01L 21/02532; H01L 21/02516; H01L 21/0245; H01L 21/02436; H01L 21/823418; H01L 29/42392; H01L 29/0673; H01L 21/8221; H01L 27/092
See application file for complete search history.

(56) References Cited

U.S. PATENT DOCUMENTS

2022/0416045 A1 * 12/2022 Park ...................... H01L 29/775

* cited by examiner

*Primary Examiner* — John A Bodnar
(74) *Attorney, Agent, or Firm* — Sterne, Kessler, Goldstein & Fox P.L.L.C.

(57) ABSTRACT

A semiconductor device includes a first transistor device of a first type. The first transistor includes first nanostructures, a first pair of source/drain structures, and a first gate electrode on the first nanostructures. The semiconductor device also includes a second transistor device of a second type formed over the first transistor device. The second transistor device includes second nanostructures over the first nanostructures, a second pair of source/drain structures over the first pair or source/drain structures, and a second gate electrode on the second nanostructures and over the first nanostructures. The semiconductor device also includes a first isolation structure between the first and second nanostructures. The semiconductor device further includes a second isolation structure in contact with a top surface of the first pair of source/drain structures. The semiconductor device also includes a seed layer between the second isolation structure and the second pair of source/drain structures.

20 Claims, 17 Drawing Sheets

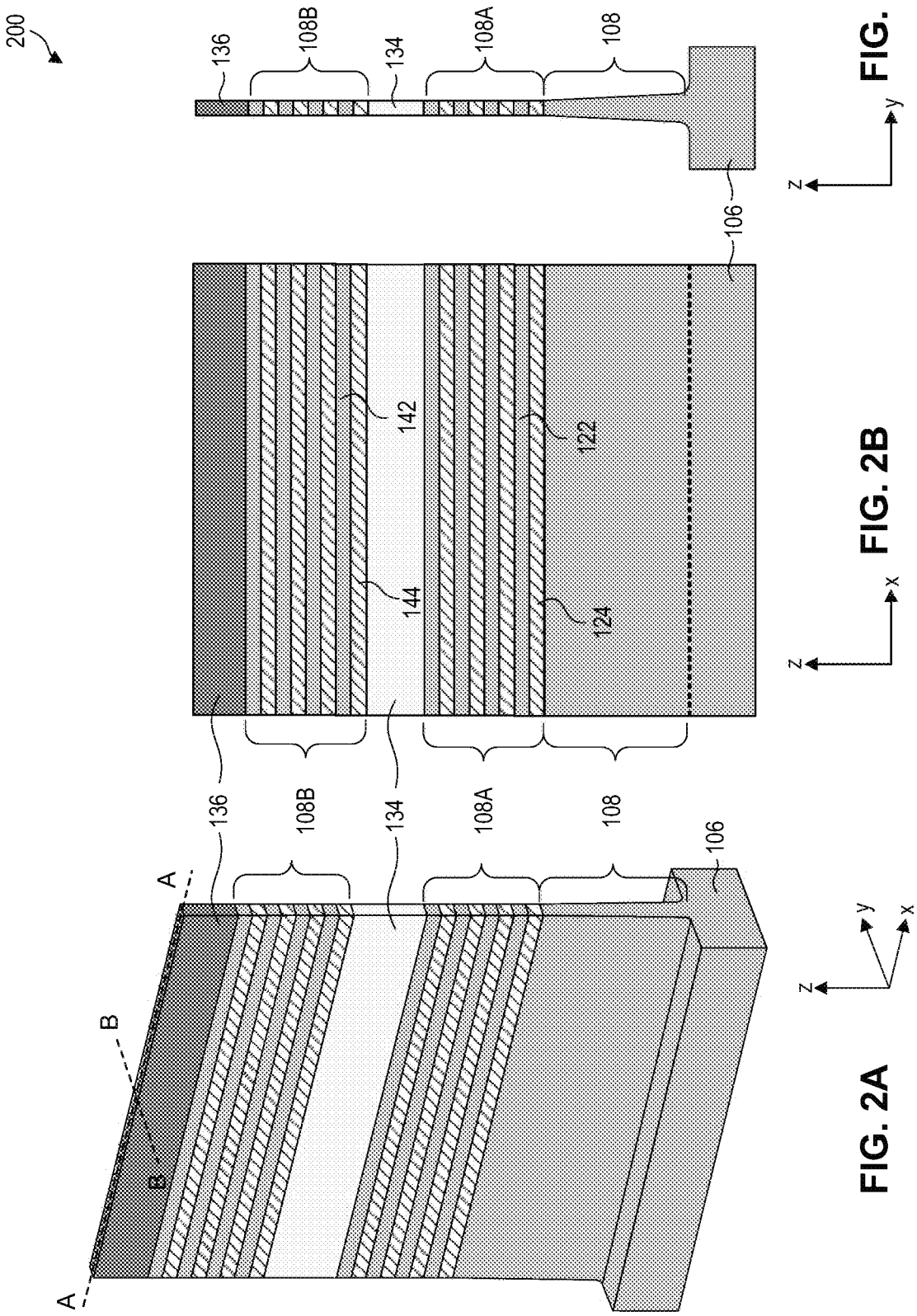

EPITAXIAL STRUCTURES FOR STACKED SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices and three-dimensional transistors, such as gate-all-around (GAA) field effect transistors and fin field effect transistors (finFETs), are introduced.

BRIEF DESCRIPTION OF THE DRAWINGS

Aspects of this disclosure are best understood from the following detailed description when read with the accompanying figures.

FIGS. 2A-2C, 3A, 3B, and 4-10 illustrate various cross-sectional views of semiconductor devices at various stages of their fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
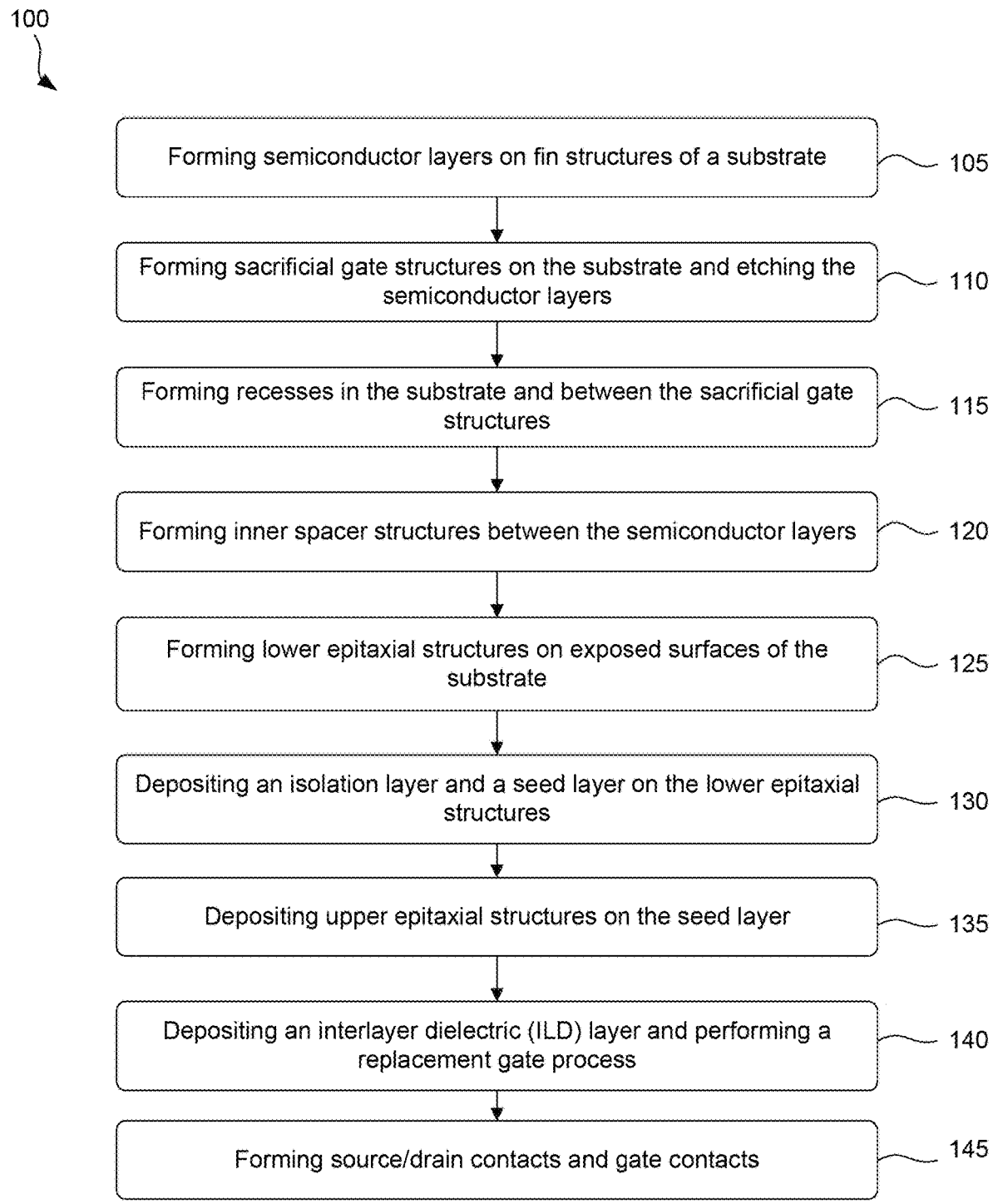
FIG. 1 is a flow diagram of a method for fabricating stacked semiconductor devices, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate, such as a semiconductor wafer, or (ii) built with vertical structures.

The term "FinFET" refers to a FET formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value), 10% of the value, 20% of the value, etc.

The terms "vertical direction" and "horizontal direction" respectively refer to z-direction and x-direction as illustrated in the figures herein.

The present disclosure provides example field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

Epitaxially grown materials are implemented in semiconductor devices to increase device speed and reduce device power consumption. For example, source/drain terminals of transistor devices formed of doped epitaxial materials can provide benefits, such as enhanced carrier mobility and improved device performance. Epitaxial source/drain terminals can be formed by epitaxially disposing crystalline material using a seed layer. As the semiconductor industry continues to scale down the dimensions of semiconductor devices, circuit complexity has increased at all device levels. For example, beyond the 5 nm technology node or the 3 nm technology node, increased source/drain tunneling can increase leakage current. Short channel effects can also be one of the reasons for device failure. Semiconductor devices implementing nanostructures, such as nanowires, are potential candidates to overcome the short channel effects. Among them, GAA transistor devices can reduce short channel effects and enhance carrier mobility, which in turn improve device performance. However, it has become increasingly challenging to further increase device density. For example, source/drain contacts with reduced surface area can lead to increased contact resistance, which can impact device performance and reduce device yield. In addition, epitaxial structures formed in high aspect ratio openings between gate structures can also lead to device defects, such as voids.

Various embodiments in the present disclosure describe methods for forming stacked semiconductor devices with improved device density and source/drain epitaxial quality and reduced source/drain contact resistance. The stacked semiconductor devices can include an upper level semiconductor device (e.g., an n-type GAAFET device) stacked on top of a lower level semiconductor device (e.g., a p-type GAAFET device). In some embodiments, a p-type FET device can be stacked over an n-type FET device. In some embodiments, the GAAFETs can implement nanostructures, such as nanowires and nanosheets, with spacers and gate structures formed between the adjacent nanostructures. Isolation structures are formed between the first and second types of semiconductor devices to provide as physical and electrical barriers for reducing cross-talk between devices. A multi-layer epitaxial source/drain formation process for the upper level semiconductor device can include forming one or more seed layers on the isolation structure and performing an epitaxial growth in order to reduce defects and prevent short channel effects. Additional epitaxial materials are disposed on the seed layers until the bulk of source/drain structures are formed. In some embodiments, lower level semiconductor devices can include multi-layer epitaxial source/drain structures. Stacked semiconductor devices and the multi-layer epitaxial source/drain structures described herein provide various benefits that can improve device performance, reliability, and yield. Benefits can include, but are not limited to, reduced source/drain contact resistance and reduced defects, among other things. The embodiments described herein use GAAFETs as examples and can be applied to other semiconductor structures, such as finFETs. In addition, the embodiments described herein can be used in various technology nodes, such as 14 nm, 7 nm, 5 nm, 3 nm, 2 nm, and other technology nodes.

FIG. 1 is a flow diagram of a method 100 for fabricating a stacked semiconductor device incorporating multi-layer epitaxial source/drain structures, according to some embodiments. For illustrative purposes, the operations illustrated in FIG. 1 will be described with reference to the example fabrication process of fabricating semiconductor device 200 as illustrated in FIGS. 2A-2C, 3A, 3B, and 4-16. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein.

Referring to FIG. 1, in operation 105, semiconductor layers are formed on fin structures of a substrate, according to some embodiments. For example, lower layer stack 108A and upper layer stack 108B can be formed on fins 108 as described with reference to semiconductor device 200 illustrated in FIGS. 2A-2C. FIG. 2B is a cross-sectional view of the structure in FIG. 2A as viewed from the A-A line. FIG. 2C is a cross-sectional view of the structure in FIG. 2A as viewed from the B-B line.

Substrate 106 can be a semiconductor material, such as silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Fin 108 extends along an x-axis. Fin 108 can be a part of substrate 106 and can include material similar to substrate 106. Fin 108 can be formed from a photolithographic patterning and an etching of substrate 106.

Lower layer stack 108A and upper layer stack 108B can each include a stack of semiconductor layers. Depending on the types of semiconductor devices formed, each semiconductor layer can be subsequently processed to form a channel region underlying subsequently formed gate structures. Lower layer stack 108A can include a first group of semiconductor layers 122 and a second group of semiconductor layers 124 stacked in an alternating configuration. Each of semiconductor layer 122 and 124 can be epitaxially grown on its underlying layer and can include semiconductor materials different from each other. In some embodiments, semiconductor layers 122 and 124 can include semiconductor materials similar to or different from substrate 106. In some embodiments, semiconductor layers 122 and 124 can include semiconductor materials with oxidation rates and/or etch selectivity different from each other. In some embodiments, each of semiconductor layers 122 can be formed of silicon and each of semiconductor layers 124 can be formed of silicon germanium (SiGe). In some embodiments, semiconductor layers 122 can be formed of silicon germanium and semiconductor layers 124 can be formed of silicon. Semiconductor layers 122 and/or semiconductor layers 124 can be undoped or can be in-situ doped during their epitaxial growth process using (i) p-type dopants, such as boron, indium, and gallium; and/or (ii) n-type dopants, such as phosphorus and arsenic. For p-type in-situ doping, p-type doping precursors, such as diborane ($B_2H_6$), boron trifluoride ($BF_3$), and any other p-type doping precursor, can be used. For n-type in-situ doping, n-type doping precursors, such as phosphine ($PH_3$), arsine ($AsH_3$), and any other n-type doping precursor, can be used. Though four layers for each of semiconductor layers 122 and semiconductor layers 124 are shown in FIGS. 2A-2C, semiconductor device 200 can have any suitable number of semiconductor layers 122 and semiconductor layers 124. Upper layer stack 108B can include semiconductor layers 142 and 144 that can be similar to semiconductor layers 122 and 124, respectively. For example, upper layer stack 108B can be formed using similar materials as lower layers stack 108A. In some embodiments, upper layer stack 108B can be formed using different materials. For example, semiconductor layers 124 and 144 can be formed of silicon germanium material and have different germanium atomic concentrations. In some embodiments, semiconductor layers 122 and 144 can be formed of different materials.

Isolation structure 134 can be formed between lower layer stack 108A and upper layer stack 108B. In some embodiments, isolation structure 134 can be formed of a low-k dielectric material (e.g., dielectric material having a dielectric constant lower than about 3.9) or any suitable dielectric materials. For example, isolation structure 134 can be formed of silicon oxide. Isolation structure 134 can be formed using suitable deposition methods, such as low-pressure chemical vapor deposition (LPCVD) and plasma-enhanced chemical vapor deposition (PECVD).

Forming lower layer stack 108A and upper layer stack 108B can include forming a stack of materials for semiconductor layers 122 and 124 on substrate 106, depositing an isolation material for isolation structure 134, forming another stack of materials for semiconductor layers 142 and 144, and etching a portion of substrate 106 and the stack of materials through patterned hard mask layer 136 formed on the stack of materials. In some embodiments, hard mask layer 136 can be formed of silicon nitride using, for example, LPCVD or PECVD deposition methods. The etching of the stack of materials can include a dry etch, a wet etch process, or a combination thereof. In some embodiments, hard mask layer 136 can be removed after lower layer stack 108A and upper layer stack 108B are formed.

Figure 3A:
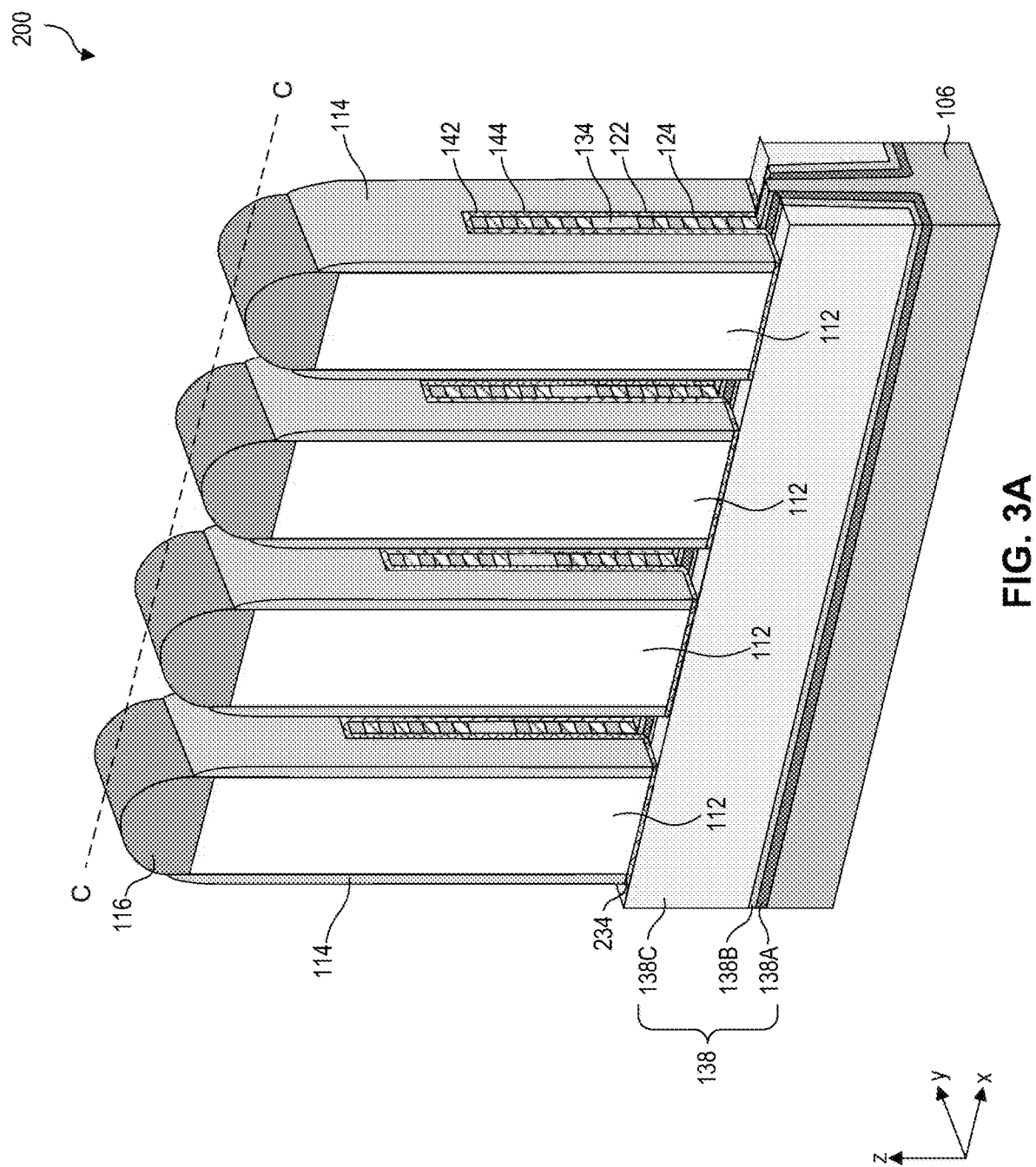
Figure 3B:
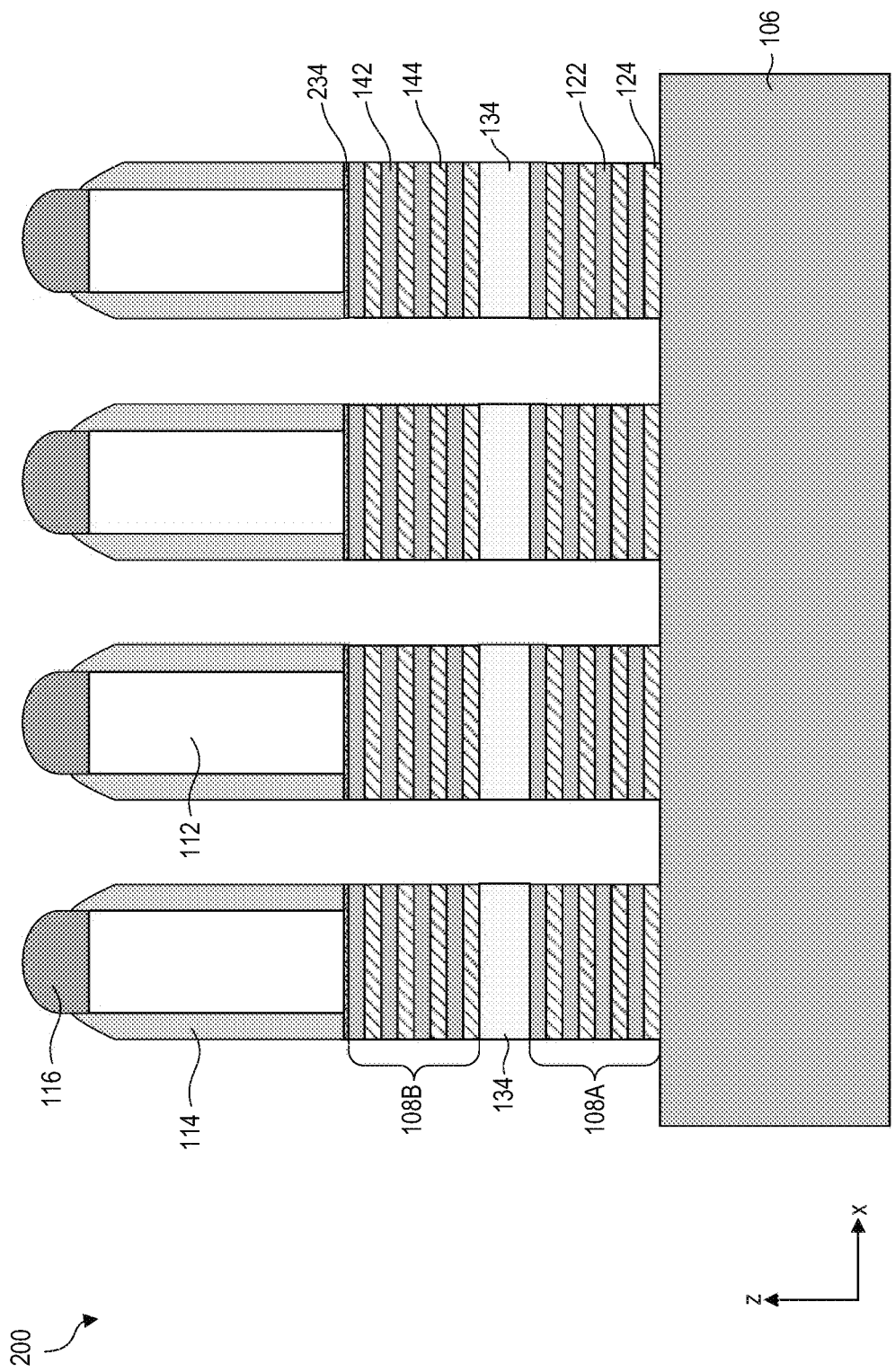

Referring to FIG. 1, in operation 110, sacrificial gate structures are formed on the substrate and the semiconductor layers are etched, according to some embodiments. Referring to FIGS. 3A and 3B, STI regions 138 with first and second protective liners 138A-138B and insulating layer 138C can be formed on substrate 106. FIG. 3B is a cross-sectional view of semiconductor device 200 in FIG. 3A as viewed from the lines of C-C. In some embodiments, hard mask layer 136 is removed prior to the formation of STI regions 138. Forming STI regions 138 can include (i) depositing a layer of nitride material (not shown) for first protective liners 138A on the structure of FIG. 2A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 3A. The layers of nitride and oxide materials can be deposited using a suitable process for depositing oxide and nitride materials, such as ALD and CVD. These layers of oxide and nitride materials can prevent oxidation of the sidewalls of lower layer stack 108A during the deposition and annealing of the insulating material for insulating layer 138C. In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane ($SiH_4$) and oxygen ($O_2$) as reacting precursors. In some embodiments, the layer of insulating material can be formed using a sub-atmospheric CVD (SACVD) process or high aspect-ratio process (HARP), where process gases can include tetraethoxysilane (TEOS) and/or ozone ($O_3$).

Polysilicon gate structures 112 are formed on STI regions 138 and on the stacks of semiconductor layers, as shown in FIGS. 3A and 3B. Polysilicon gate structures 112 are sacrificial gate structures and can be replaced in a gate replacement process to form metal gate structures. In some embodiments, the formation of polysilicon gate structures 112 can include blanket depositing a layer of polysilicon material and etching the layer of polysilicon material through a patterned hard mask layer 116 formed on the layer of polysilicon material. In some embodiments, the layer of polysilicon material can be undoped and hard mask layer 116 can include an oxide layer and/or a nitride layer. The oxide layer can be formed using a thermal oxidation process and the nitride layer can be formed by LPCVD or PECVD deposition processes. Hard mask layer 116 can protect polysilicon gate structures 112 from subsequent processing steps (e.g., during formation of spacers 114, source/drain regions, and/or ILD layers). The blanket deposition of the layer of polysilicon material can include CVD, PVD, ALD, or any other suitable deposition process. In some embodiments, etching of the deposited layer of polysilicon material can include a dry etch, a wet etch, or a combination thereof. Spacers 114 can be formed on sidewalls of polysilicon gate structures 112. Forming spacers 114 can include blanket depositing a layer of an insulating material (e.g., an oxide, a nitride, and/or silicon carbon oxynitride material) followed by photolithography and an etching processes (e.g., reactive ion etching or any other suitable dry etching process using a chlorine- or fluorine-based etchant) In some embodiments, one or more liner layers 234 can be formed on lower layer stack 108A and upper layer stack 108B prior to the formation of polysilicon gate structures 112. Liner layer 234 can be formed using any suitable dielectric material, such as silicon nitride, silicon carbide, silicon oxycarbide, and silicon oxycarbonitride.

Portions of the upper and lower layer stacks not covered and protected by polysilicon gate structures 112 can be etched. The etch process can remove portions of semiconductor layers 122 and semiconductor layers 124 that are exposed between adjacent polysilicon gate structures 112. The etch process can include a wet etch process using, for example, diluted hydrofluoric (HF) acid. In some embodiments, one or more etching process can be used. For example, the etching process can include an etching process for removing silicon material and another etching process for removing silicon germanium material. During the etching process, polysilicon gate structures 112 can be protected from being etched by spacers 114 and hard mask layer 116.

Figure 4:
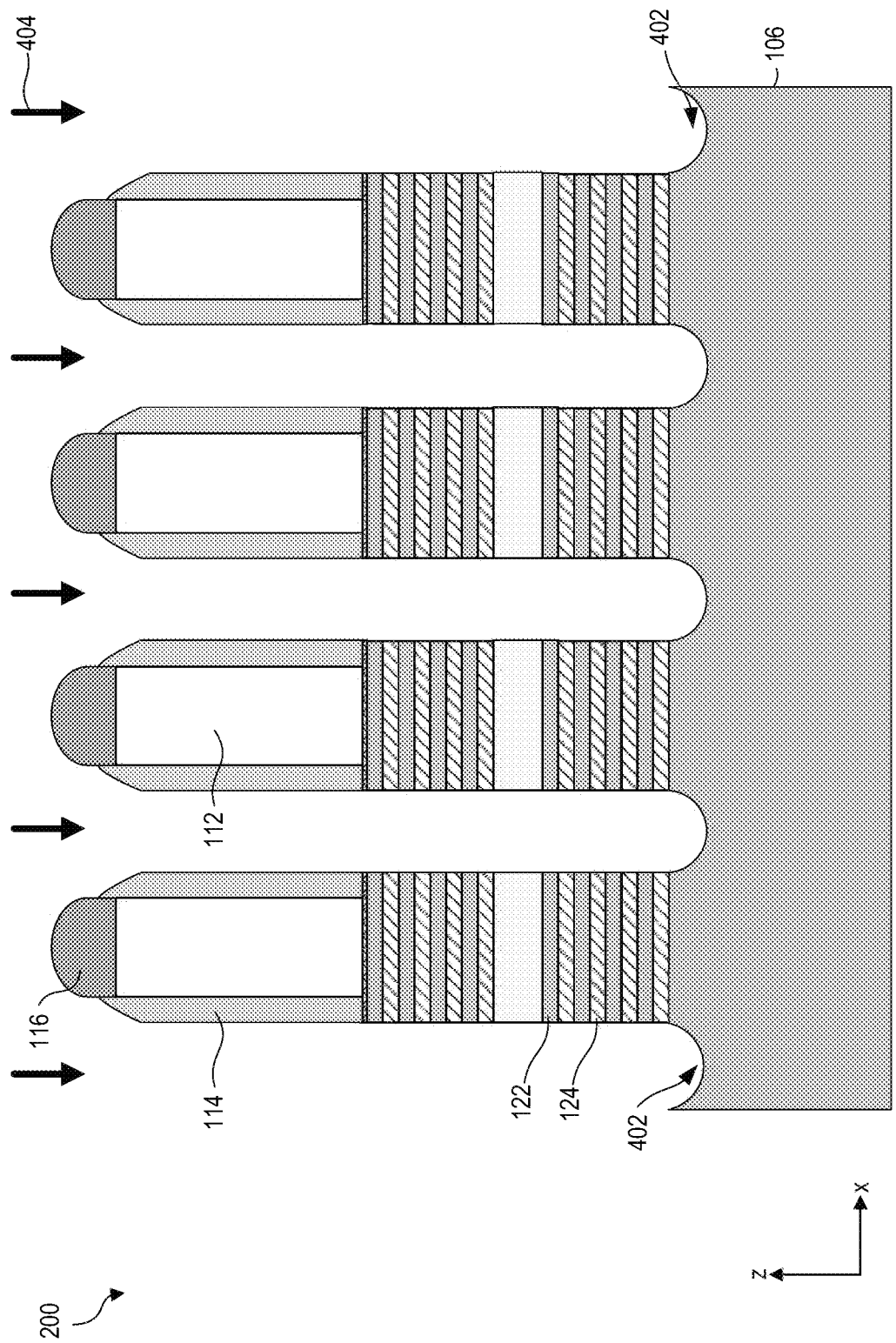

Referring to FIG. 1, in operation 115, recesses can be formed in the substrate between polysilicon gate structures, according to some embodiments. Referring to FIG. 4, recesses 402 (e.g., grooves) can be formed in substrate 106 and between adjacent poly gate structures 112. Recesses 402 can be formed using an anisotropic etching process 404 with an etching rate in the vertical direction (e.g., along the z-axis) substantially greater than an etching rate in the horizontal direction (e.g., along the x-axis). For example, a plasma etching process using fluorine and/or chlorine etchants can be used. In some embodiments, the plasma etching process can use sulfur hexafluoride, carbon tetrafluoride, fluoroform, boron trichloride, hydrogen bromide, any suitable etchants, or combinations thereof. In some embodiments, a voltage bias can be applied to substrate 106 to increase the etching rate in the vertical direction. In some embodiments, recesses 402 can be formed during operation 110 of etching semiconductor layers 122 and semiconductor layers 124. For example, etching semiconductor layers 122 and 124 can include alternating cycles of etching processes, and etching process 404 can use similar plasma species as the plasma etching process for etching semiconductor layers 122. In some embodiments, the formation of recesses between polysilicon gate structures is optional.

Figure 5:
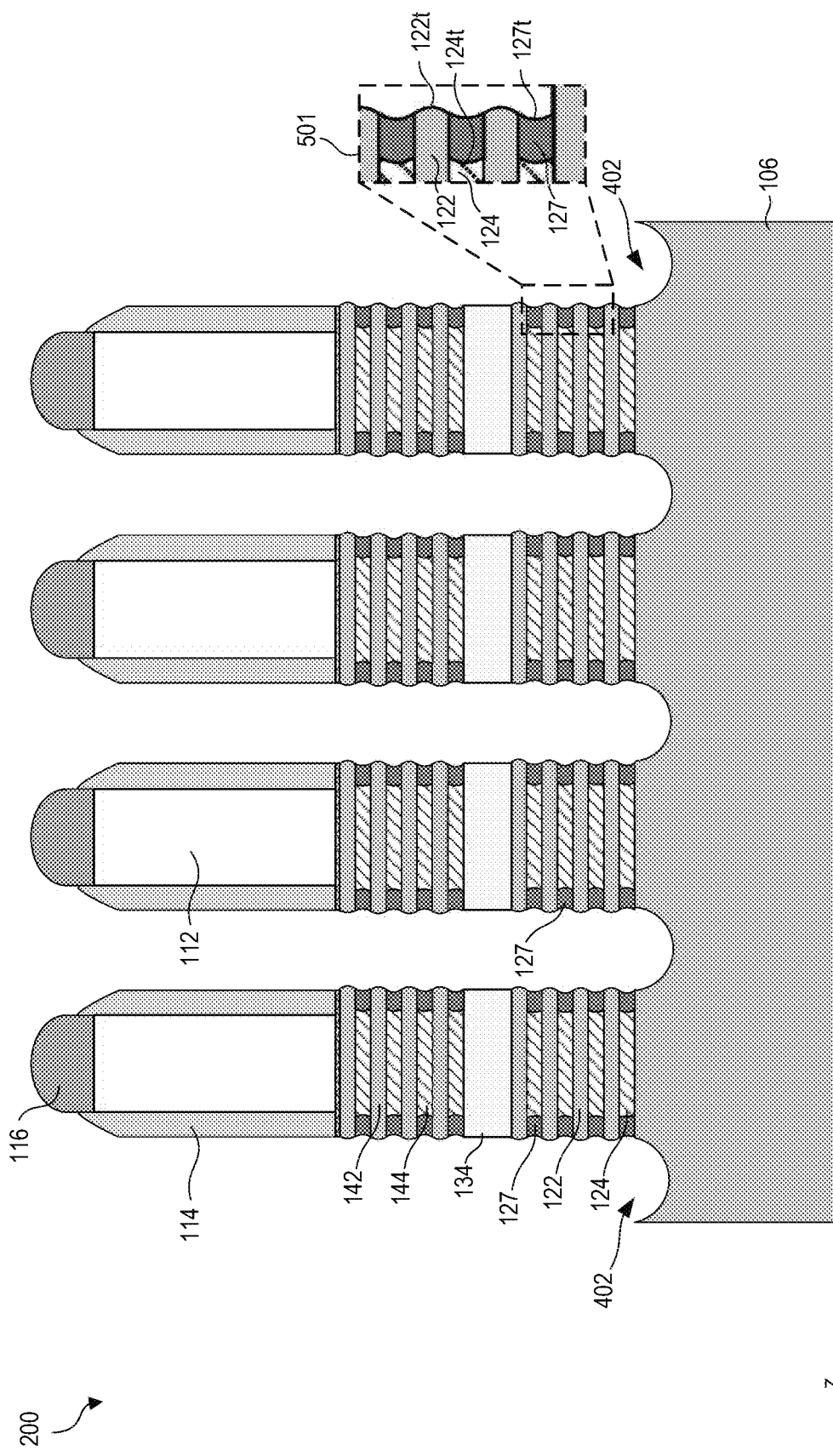

Referring to FIG. 1, in operation 120, inner spacer structures are formed between the semiconductor layers, according to some embodiments. Referring to FIG. 5, portions of semiconductor layers 124 and 144 can be etched back to form recessed regions and dielectric material can be deposited in the recessed regions to form inner spacers 127. In some embodiments, depending on device design, other portions of the semiconductor layers can be etched back. For example, portions of semiconductor layers 122 and semiconductor layers 142 can be etched back such that a dielectric material can be deposited to form inner spacers 127. In another example, semiconductor layers 122 of lower layer stack and semiconductor layers 144 of upper layer stack are etched back. In a further example, semiconductor layers 124 of lower layer stack 108A and semiconductor layers 142 of upper layer stack 108B are etched back. The aforementioned examples are not shown in FIG. 5 for simplicity.

Semiconductor layers 124 can be etched back by a dry etching process, a wet etching process, or a combination thereof. In some embodiments, the etch back process of semiconductor layers 124 can be configured to form non-planar outer surfaces of semiconductor layers 122 and 124. As shown in enlarged view 501 of FIG. 5, semiconductor layers 122 can have curved convex outer surfaces 122t and semiconductor layers 124 can have curved concave outer surfaces 124t. In some embodiments, subsequently formed inner spacers 127 can also have outer surfaces 127t that substantially contour outer surface 124t of semiconductor layers 124. The non-planar (e.g., curved) outer surfaces of inner spacers 127 and semiconductor layers 122 can reduce voids in subsequently formed source/drain structures by removing sharp corners where voids tend to form.

Inner spacers 127 can be formed on the concave outer surface 124t of semiconductor layers 124 and on top/bottom surfaces of semiconductor layers 122 by a blanket deposition of a dielectric material layer and a horizontal etch of the blanket-deposited dielectric material layer. In some embodiments, the blanket deposition process can include a plurality of cycles of deposition and etch processes. In each cycle, the etch process can follow the deposition process to prevent the formation of voids within inner spacers 127. Inner spacers 127 can include a single layer or a stack of dielectric layers, deposited by ALD, FCVD, or any other suitable deposition process. The etch process in each cycle of the blanket deposition process of dielectric material layer can include a dry etch process using a gas mixture of hydrogen fluoride (HF) and ammonia (NH$_3$). Inner spacer structures 127 can include suitable dielectric material, such as silicon, oxygen, carbon, and nitrogen. The horizontal etch process of the blanket deposited dielectric material layer to form inner spacers 127 can be performed by a dry etch process using a gas mixture of HF and NH$_3$. Other methods of deposition and horizontal etch processes for forming inner spacer structures 127 can be used.

Figure 6:
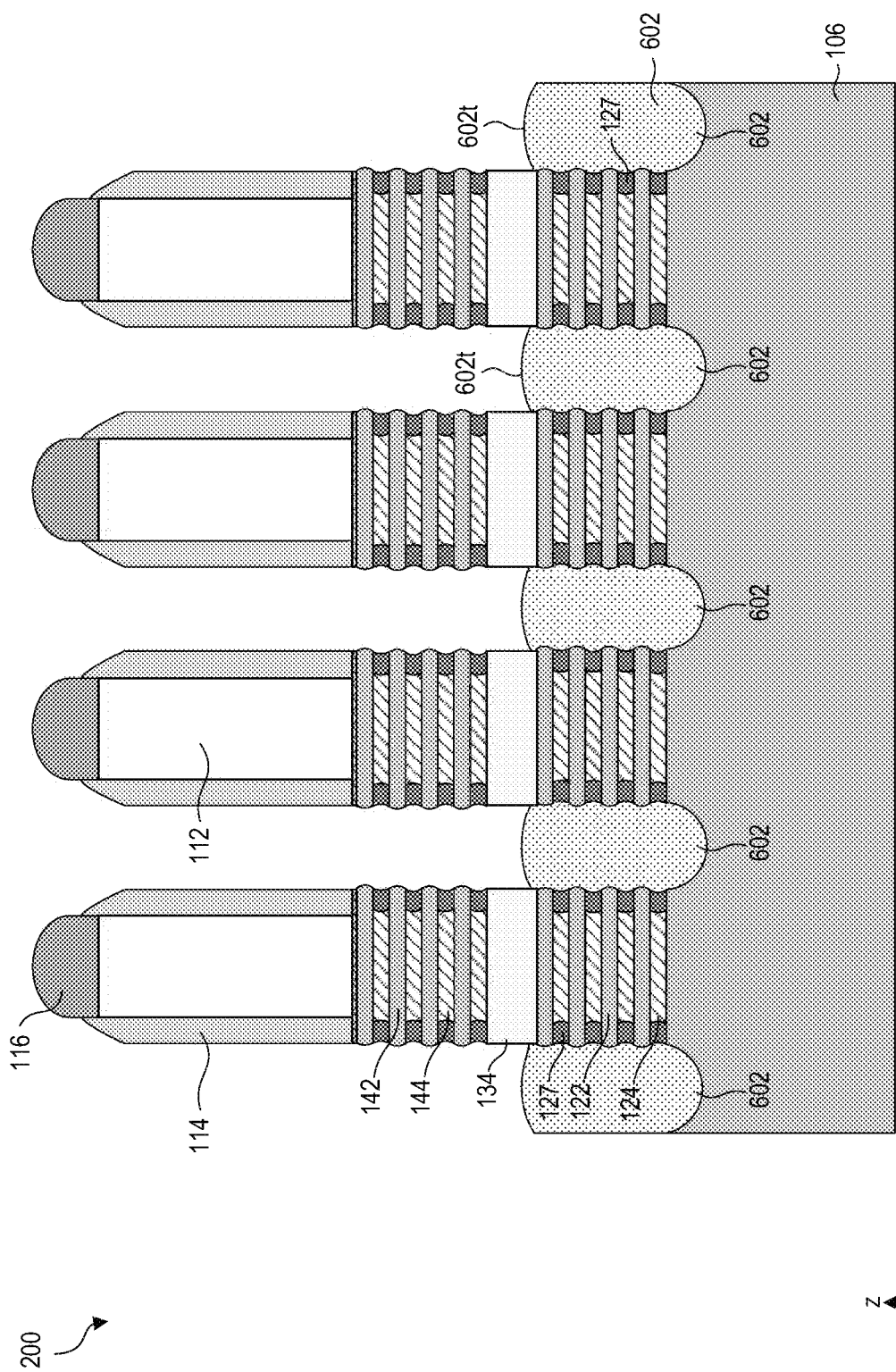

Referring to FIG. 1, in operation 125, a lower epitaxial structure can be disposed on the exposed surfaces of the substrate, the inner spacers, and the semiconductor layers, according to some embodiments. Referring to FIG. 6, lower epitaxial structures 602 can be deposited in recesses 402 illustrated in FIG. 5 as well as outer surfaces of semiconductor layers 122 and inner spacers 127. In some embodiments, the deposition process of lower epitaxial structures 602 can continue until lower epitaxial structures 602 contact isolation structures 134. In some embodiments, upper surfaces of lower epitaxial structures 602 can be between upper and lower surfaces of isolation structures 134. For example, the upper surfaces 602t of lower epitaxial structures 602 are below the upper surfaces of isolation structures 134 and above the lower surfaces of isolation structures 134. In some embodiments, the upper surfaces 602t of lower epitaxial structures 602 can include a non-planar surface. For example, the upper surfaces 602t can include a convex surface. In some embodiments, semiconductor device 200 is configured to have n-type devices stacked on p-type devices. For example, semiconductor device 200 can include n-type devices stacked over p-type devices. In some embodiments, lower epitaxial structures 602 illustrated in FIG. 6 can be used for forming the source/drain regions for p-type devices. In some embodiments, lower epitaxial structures 602 can be formed by silicon, silicon germanium, silicon germanium doped with boron, germanium, indium antimonide, gallium antimonide, indium gallium antimonide, or any suitable epitaxial material. In some embodiments, a height of lower epitaxial structures 602 can be between about 2 nm and about 35 nm, between about 3 nm and about 30 nm, or any suitable height values.

In some embodiments, one or more pre-deposition processes can be performed to prepare the exposed surfaces for the epitaxial growth process. For example, the pre-deposition process can be a dry etching process that includes a SICONI process that includes ammonia (NH$_3$) and nitrogen trifluoride (NF$_3$) plasma, an anneal process, or any suitable pre-deposition treatment processes. In some embodiments, the anneal process can be performed at a temperature between about 400° C. and about 800° C., between about 500° C. and about 700° C., between about 550° C. and about 650° C., or any suitable temperatures. In some embodiments, the deposition process of lower level epitaxial structures can include a plasma deposition process using suitable precursors, such as hydrogen, nitrogen, silane, dichlorosilane (DCS), diborane (B$_2$H$_6$), hydrogen chloride (HCl), any suitable precursors, and combinations thereof. In some embodiments, lower epitaxial structures 602 can be formed by epitaxially growing a crystalline material using exposed portions of substrate 106 and semiconductor layers 122 as seed layers. In some embodiments, the epitaxial growth process of lower epitaxial structures 602 can be performed in a deposition chamber with a chamber pressure maintained between about 5 Torr and about 350 Torr, between about 10 Torr and about 300 Torr, or any suitable chamber pressure level. In some embodiments, the deposition temperature of the deposition chamber can be maintained between about 550° C. and about 800° C., between about 575° C. and about 775° C., between about 600° C. and about 750° C., or any suitable deposition temperatures.

Lower epitaxial structures 602 can be deposited using suitable deposition methods, such as (i) chemical vapor deposition (CVD), including but not limited to, plasma-enhanced CVD (PECVD), low-pressure CVD (LPCVD), atomic layer CVD (ALCVD), ultrahigh-vacuum CVD (UHVCVD), reduced-pressure CVD (RPCVD), and any other suitable CVD; (ii) molecular beam epitaxy (MBE) processes; (iii) any suitable epitaxial process; and (iv) a combination thereof. In some embodiments, lower epitaxial structure 602 can be grown by an epitaxial deposition/partial etch process, which repeats the epitaxial deposition/partial etch process at least once. Such repeated deposition/partial etch process is also called a cyclic deposition-etch (CDE) process. In some embodiments, a plasma deposition process using species, such as germane, dichlorosilane, and hydrochloride, can be used to deposit lower epitaxial structures 602 formed of silicon germanium. In some embodiments, a plasma deposition process using phosphane can be used to deposit first epitaxial layer formed of silicon phosphide.

Figure 7:
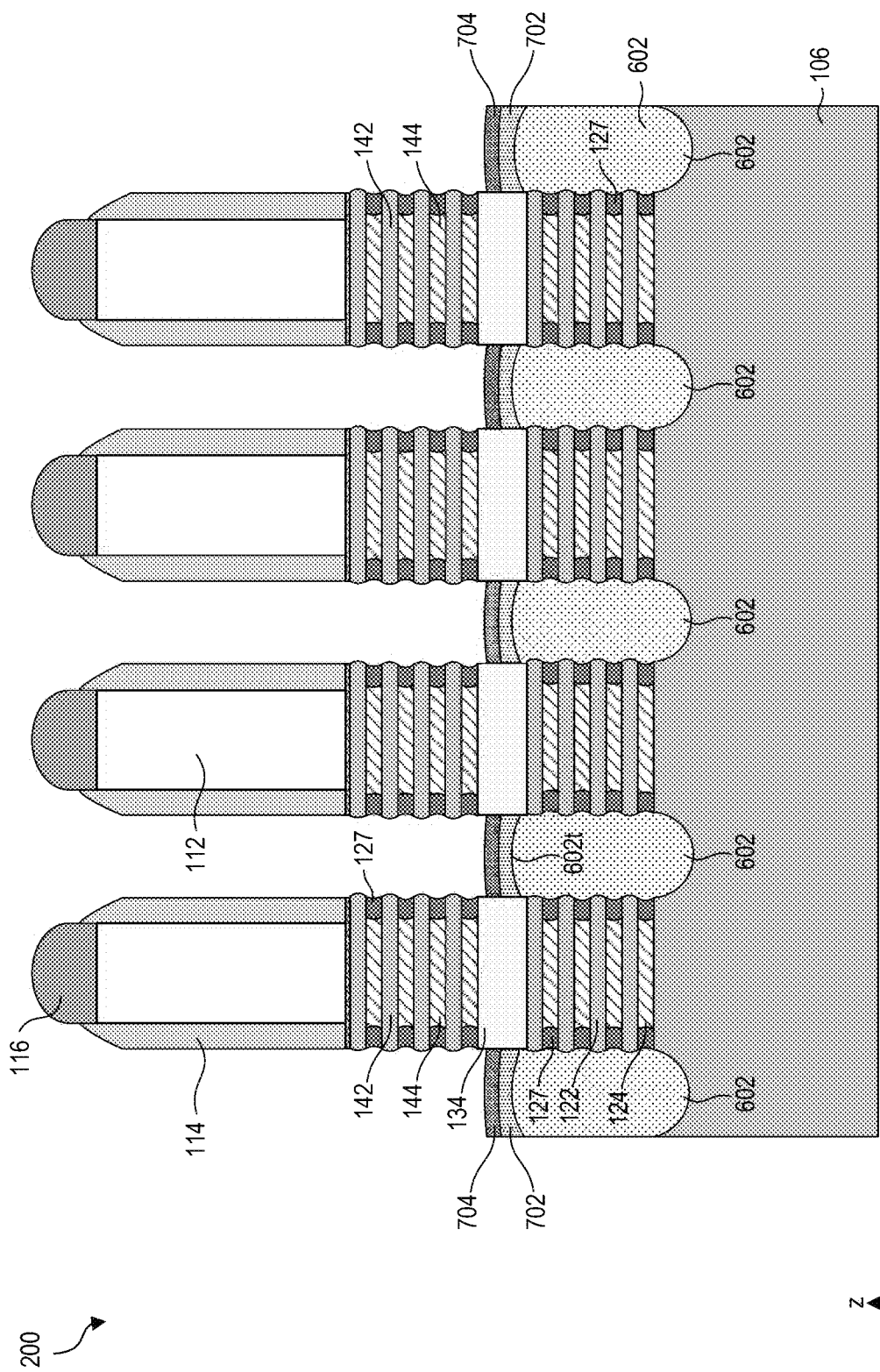

Referring to FIG. 1, in operation 130, an isolation layer and a seed layer are deposited on the lower epitaxial structures, according to some embodiments. Referring to FIG. 7, isolation layer 702 is deposited on top surface 602t of lower epitaxial structures 602 and seed layer 704 is deposited on isolation layer 702. Isolation layer 702 and/or seed layer 704 can be formed by a blanket deposition process followed by an etch back process such that the deposited material only remains at the bottom of the openings between adjacent gate structures. In some embodiments, isolation layer 702 can be formed of any suitable isolation material, such as silicon oxide, silicon nitride, silicon oxynitride, silicon carbide, and combinations thereof. In some embodiments, isolation layer 702 can have a thickness that is between about 15 nm and about 120 nm, between about 20 nm and about 110 nm, between about 25 nm and about 100 nm, or any suitable dimensions.

Seed layer 704 can be formed using crystalline materials suitable for the subsequent epitaxial deposition of the source/drain structure for the upper level devices. In some embodiments, seed layer 704 can be formed of a silicon material formed by a deposition of amorphous silicon followed by a low-temperature crystallization process to preserve the heat budget of semiconductor device 200. In some embodiments, an amorphous layer of silicon can be blanket deposited on isolation layer 702, inner spacers 127, semiconductor layers 142 and 144, spacers 114, and hard mask layers 116. An etch back process can be performed such that the amorphous layer remains on the top surface of isolation layers 702. The etch back process can be performed using a plasma etching process using suitable plasma species, such as hydrogen bromide, chlorine, sulfur hexafluoride, and combinations thereof. In some embodiments, a high-frequency oxygen plasma treatment can be performed followed by a wet etching process performed in a diluted hydrofluoric acid solution. In some embodiments, the crystallization process can be performed by excimer laser crystallization that enables a liquid phase epitaxial regrowth (LPER) process. In some embodiments, the laser energy level of the excimer laser crystallization process can be between about 70 mJ/cm$^2$ and about 530 mJ/cm$^2$, between about 85 mJ/cm$^2$ and about 515 mJ/cm$^2$, between about 100 mJ/cm$^2$ and about 500 mJ/cm$^2$, or any suitable laser energy levels. In some embodiments, the crystallization process can include a solid phase epitaxy process, such as a solid phase epitaxial regrowth (SPER) anneal process. The anneal temperature for the SPER anneal process can be maintained below 600° C., such as a temperature between about 400° C. and about 600° C. In some embodiments, the crystallization process can include an SPER process followed by an LPER process. In some embodiments, the SPER process and/or LPER process can be performed for a time period between about 1.5 hours and about 6.5 hours, between about 1.7 hours and about 6.3 hours, between about 2 hours and about 6 hours, or any suitable time periods.

Figure 8:
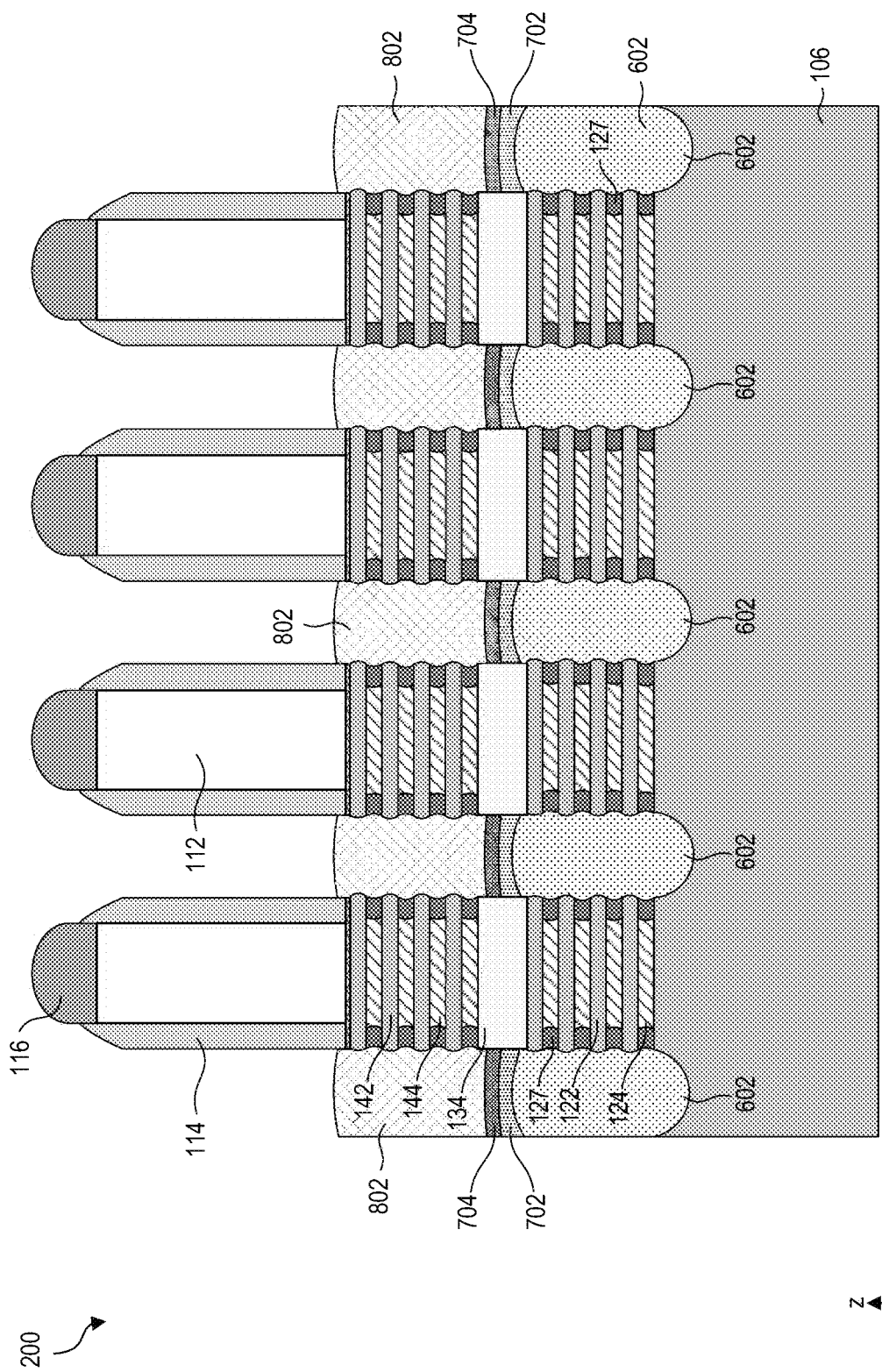

Referring to FIG. 1, in operation 135, upper epitaxial structures are deposited on the seed layers, according to some embodiments. Referring to FIG. 8, upper epitaxial structures 802 can be formed between opposing stacks of semiconductor layers 142 and 144 and on seed layers 704. Upper epitaxial structures 802 can be epitaxially grown from top surfaces of seed layers 704. In some embodiments, upper epitaxial structures 802 can be used as the source/drain terminals for upper level semiconductor devices, such as n-type GAAFETs. For example, upper epitaxial structures 802 can be formed using silicon phosphide, silicon arsenide, silicon carbide, silicon phosphide carbide, indium phosphide, gallium arsenide, aluminum arsenide, indium arsenide, indium aluminum arsenide, indium gallium arsenide, or any suitable material. In some embodiments, one or more pre-deposition processes can be performed to prepare the exposed surfaces for the epitaxial growth process. For example, the pre-deposition process can be a dry etching process that includes ammonia (NH$_3$) and nitrogen trifluoride (NF$_3$) plasma (e.g., a SICONI process), an anneal process, or any suitable pre-deposition treatment processes. In some embodiments, the anneal process can be performed at a temperature below about 800° C. For example, the anneal temperature can be between about 400° C. and about 800° C., or any suitable temperatures. In some embodiments, the deposition process of upper epitaxial structures 802 can include a plasma deposition process using suitable precursors, such as hydrogen, nitrogen, dichlorosilane (DCS), phosphane (PH$_3$), arsine (AsH$_3$), hydrogen chloride (HCl), any suitable precursors, and combinations thereof. In some embodiments, the epitaxial growth process of upper epitaxial structures 802 can be performed in a deposition chamber with a chamber pressure maintained between about 5 Torr and about 350 Torr, between about 10 Torr and about 300 Torr, or any suitable chamber pressure level. In some embodiments, the deposition temperature of the deposition chamber can be maintained between about 500° C. and about 750° C., between about 520° C. and about 720° C., between about 550° C. and about 700° C., or any suitable deposition temperatures.

Upper epitaxial structures 802 can be deposited using suitable deposition methods, such as (i) CVD, including but not limited to, PECVD, LPCVD, ALCVD, UHVCVD, RPCVD, and any other suitable CVD processes; (ii) MBE processes; (iii) any suitable epitaxial process; and (iv) a combination thereof. In some embodiments, upper epitaxial structure 802 can be grown by an epitaxial deposition/partial etch process. In some embodiments, upper epitaxial structures 802 can have a non-uniform atomic concentration of phosphorous or arsenic that decreases or increases from a top surface to a bottom surface of its epitaxial body.

Figure 9:
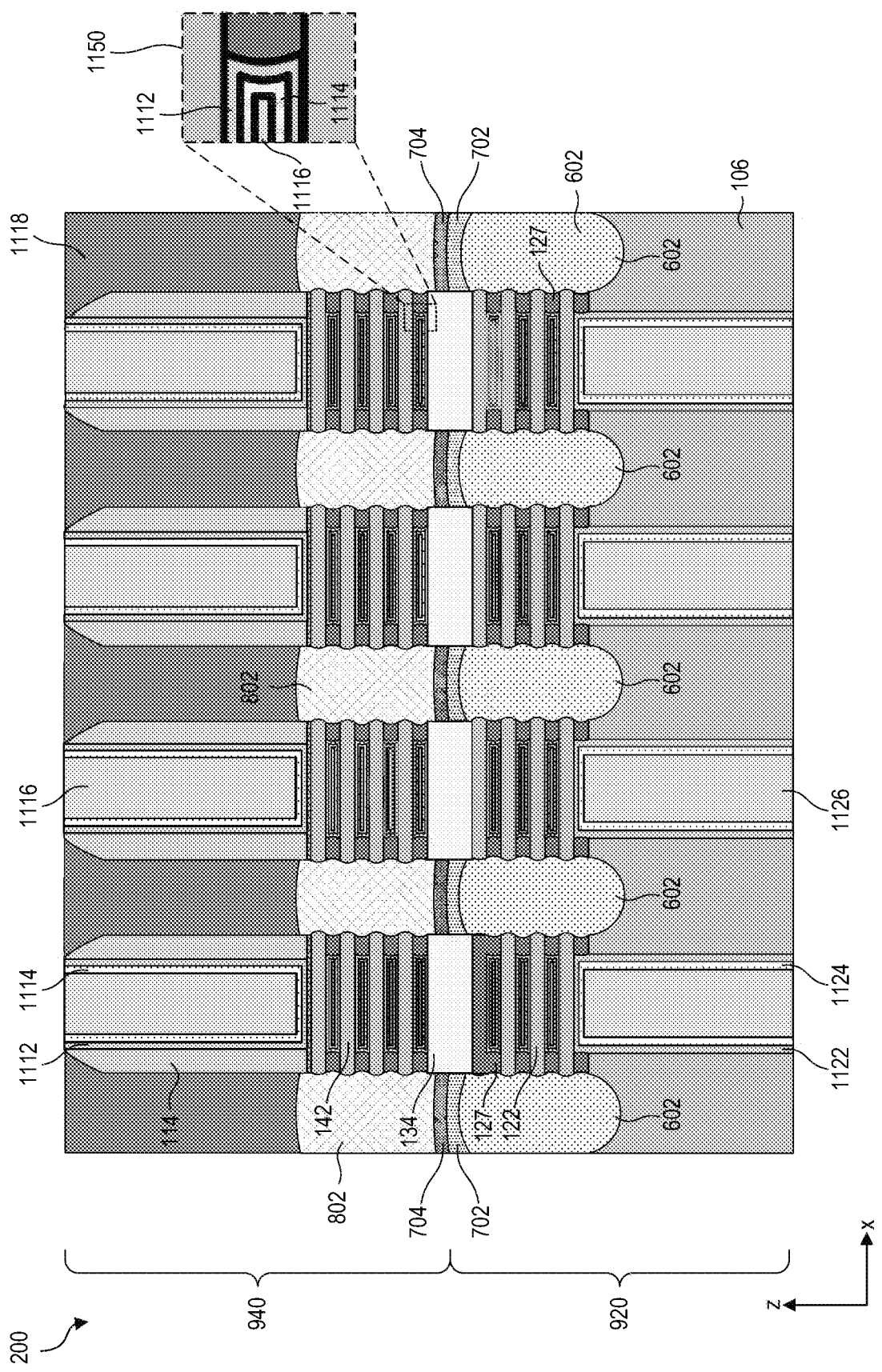

Referring to FIG. 1, in operation 140, an interlayer dielectric (ILD) layer is deposited and a replacement gate process is performed, according to some embodiments. Referring to FIG. 9, ILD layer 1118 is deposited between spacers 114 and on top surfaces of upper epitaxial structures 802. Upper metal gate structures for the upper level semiconductor devices can be formed by replacing the polysilicon gate structures with metal gate electrodes, and lower metal gate structures for the lower level semiconductor devices can be formed through the back surface of substrate 106.

Prior to the gate replacement process, ILD layer 1118 can be disposed on top surfaces of upper epitaxial structures 802 and on sidewalls of spacers 114. ILD layer 1118 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. Other materials and formation methods for ILD layer 1118 are within the scope and spirit of this disclosure.

The formation of ILD layer 1118 can be followed by removing polysilicon gate structures 112, semiconductor layers 124, and semiconductor layers 144 using a dry etching process (e.g., reaction ion etching) or a wet etching process, exposing portions of the upper or lower surfaces of semiconductor layers 122. The exposed semiconductor layers 122 and 142 can be referred to as nanostructures (e.g., nanowires or nanosheets). The nanostructures formed by semiconductor layers 122 and 142 can be used as channels for subsequently formed lower and upper semiconductor devices, respectively. Alternatively, not shown in FIG. 9, semiconductor layers 122 and 142 can be removed to expose portions of semiconductor layers 124 and 144, which can also be referred to as nanostructures. In some embodiments, semiconductor layers 122 and semiconductor layers 144 are removed such that portions of semiconductor layers 124 and semiconductor layers 142 form the channel regions of lower and upper level semiconductor devices. In some embodiments, semiconductor layers 124 and semiconductor layers 142 are removed such that portions of semiconductor layers 122 and semiconductor layers 144 form the channel regions. In some embodiments, the gas etchants used in the dry etching process can include chlorine, fluorine, bromine, or a combination thereof. In some embodiments, an ammonium hydroxide (NH$_4$OH), sodium hydroxide (NaOH), and/or potassium hydroxide (KOH) wet etch can be used to remove polysilicon gate structures 112, semiconductor layer 124, or a dry etch followed by a wet etch process can be used. Gate dielectric layers 1112 can be formed on the semiconductor layers. As shown in FIG. 9, gate dielectric layers 1112 can be wrapped around on exposed nanowire-shaped semiconductor layers 122 and 142.

Forming gate dielectric layers 1112 can include a blanket deposition process of a suitable gate dielectric material layer. In some embodiments, gate dielectric layers 1112 can be formed of a high-k dielectric material (e.g., dielectric material having dielectric constant greater than about 3.9). For example, gate dielectric layers 1112 can be formed of hafnium oxide. Work function layers 1114 are formed on gate dielectric layers 1112. In some embodiments, each work function layer 1114 can include one or more work function layers and formed using the same or different material and/or thickness. Gate dielectric layers 1112 and gate work function layers 1114 can each wrap around nanowire-shaped semiconductor layers 122. Depending on the spaces between adjacent semiconductor layers 122, semiconductor layers 122 can be wrapped around by gate dielectric layer 1112 and work function layers 1114, filling the spaces between adjacent semiconductor layers 122 and 142. In some embodiments, subsequently formed gate electrode material can also be formed in the spaces between adjacent semiconductor layers 122 and 142, as described below.

Gate electrodes 1116 can be formed on the work function layers, according to some embodiments. Layers of conductive material for gate electrodes 1116 are formed on work function layers 1114. As shown in enlarged view 1150, if separations between adjacent semiconductor layers 142 are sufficient to accommodate the thickness of the gate electrode material, gate electrodes 1116 can be formed between adjacent semiconductor layers 142 and on work function layers 1114 such that the spaces between adjacent semiconductor layers 142 are filled. Gate electrodes 1116 between adjacent semiconductor layers 142 and gate electrodes 1116 between spacers 114 are electrically coupled to each other. Openings can be formed from the back surface of substrate 106 to expose semiconductor layers 122 and gate electrodes 1126 can be formed between adjacent semiconductor layers 122 by depositing a conductive material, such as a suitable metal material. Gate electrodes 1126 that are between adjacent semiconductor layers 122 and gate electrodes that are formed in substrate 106 are electrically coupled to each other. The layer of conductive material for gate electrodes 1116 and 1126 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and combinations thereof. Gate electrodes 1116 and 1126 can be formed by ALD, PVD, CVD, or any other suitable deposition process. The deposition of gate electrodes 1116 can continue until openings between opposing spacers 114 are filled with gate electrodes 1116. A chemical mechanical polishing process can remove excessive gate electrodes 1116 such that top surfaces of gate electrodes 1116 and ILD layer 1118 are substantially coplanar. Similarly, the deposition of gate electrodes 1126 can continue until openings in substrate 106 are filled with gate electrodes 1126. Another chemical mechanical polishing process can be performed on the back surface of substrate 106 such that surfaces of gate electrodes 1126, substrate 106, gate dielectric layer 1122, and work function layers 1124 are substantially coplanar. In some embodiments, other structures can be formed, such as blocking layers. One or more blocking layers (not shown in FIG. 9) can be formed prior to depositing gate electrodes 1116 and 1126 to prevent diffusion and oxidation of gate electrode materials.

Lower level semiconductor devices 920 and upper level semiconductor devices 940 can be formed after the formation of the metal gates. In some embodiments, lower level semiconductor devices 920 can be p-type FET (PFET) devices including nanostructures, such as nanowires and nanosheets. In some embodiments, lower level semiconductor devices 920 can include nanowires formed by semiconductor layers 122. Upper level semiconductor devices 940 can be n-type FET (NFET) devices including nanowires formed by semiconductor layers 142.

Figure 10:
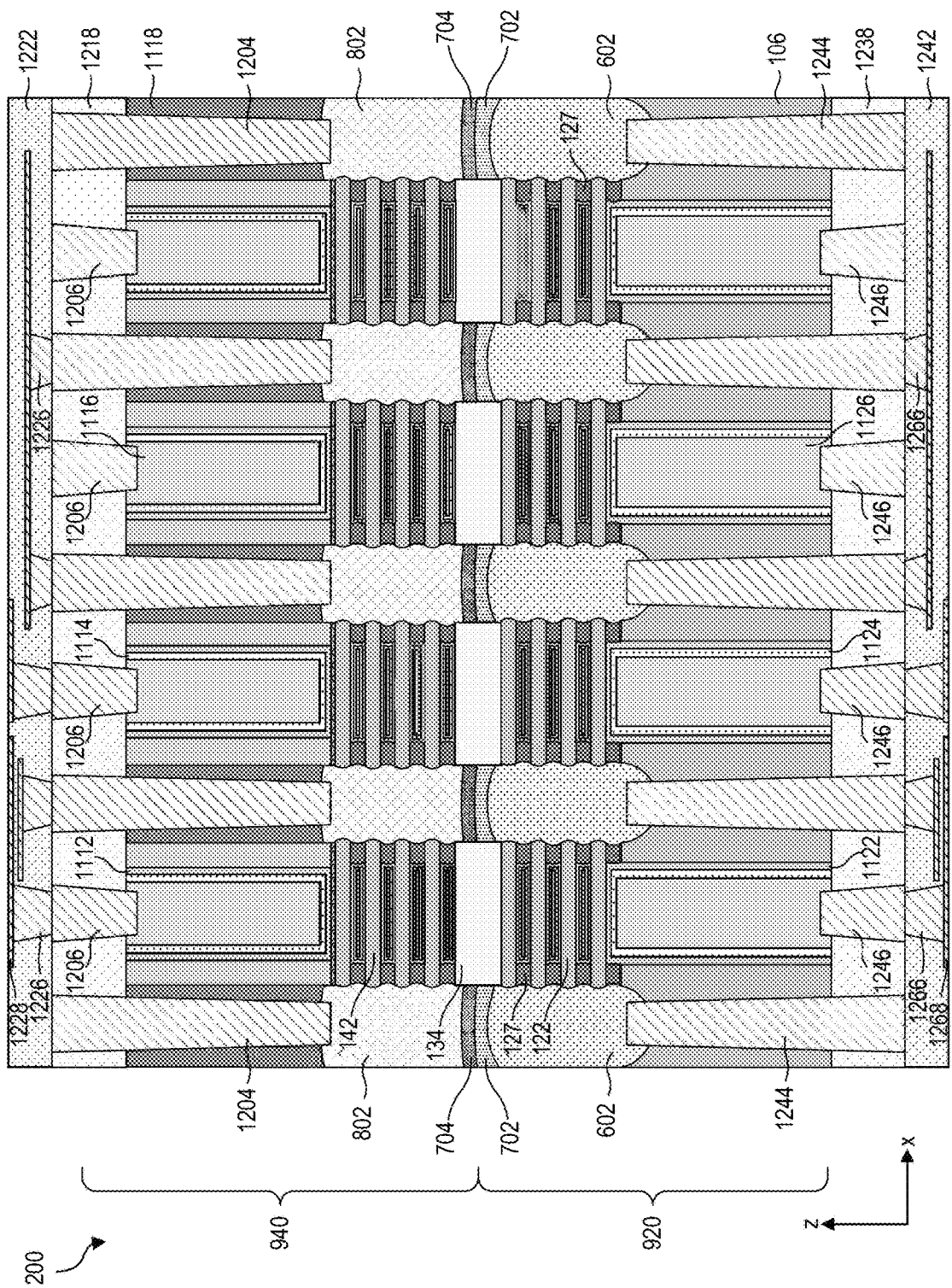

Referring to FIG. 1, in operation 145, source/drain contacts and gate contacts are formed, according to some embodiments. Referring to FIG. 10, source/drain contacts 1204 and gate contacts 1206 are formed to provide electrical connections to the source/drain regions and the gate electrodes of the upper level semiconductor devices, respectively. Specifically, source/drain contacts 1204 and gate contacts 1206 can be used to transmit electrical signals between source/drain regions and gate electrodes and external terminals (not shown in FIG. 10). For example, gate contacts 1206 can be electrically coupled to gate electrodes 1116 formed between spacers 114 and between adjacent semiconductor layers 122. Additional ILD layers can be formed on the top surface ILD layer 1118. For example, dielectric layer 1218 can be formed on ILD layer 1118. In some embodiments, dielectric layer 1218 can be formed using a similar material as ILD layer 1118. Gate contacts 1206 and source/drain contacts 1204 can be formed by forming openings in dielectric layer 1218, ILD layer 1118, and gate electrodes 1116 and depositing a conductive material in the openings. Silicide layers can be formed between source/drain contacts 1204 and upper epitaxial structures 802. For example, the deposition process of forming source/drain contact can include depositing a metal layer within the openings and performing an anneal process to induce silicidation of the deposited metal layer. The conductive materials for forming source/drain contacts 1204 and gate contacts 1206 can include titanium, aluminum, silver, tungsten, cobalt, copper, ruthenium, zirconium, nickel, titanium nitride, tungsten nitride, metal alloys, or combinations thereof. The deposition process can include ALD, PVD, CVD, any suitable deposition processes, or combinations thereof.

Source/drain contacts and gate contacts can also be formed for electrically coupling to the terminals of lower level semiconductor devices 920. For example, source/drain contacts 1244 and gate contacts 1246 can be formed for providing electrical connections to lower level epitaxial structures 602 and gate electrodes 1126. Gate contacts 1246 can be electrically coupled to gate electrodes 1126, and source/drain contacts 1244 can be electrically coupled to lower level epitaxial structures 602. Semiconductor device 200 can be flipped over for the formation of source/drain contacts 1244 and gate contacts 1246. Additional dielectric layers can be formed on the bottom surface of substrate 106 before the contacts are formed. For example, dielectric layer 1238 can be formed on substrate 106. In some embodiments, dielectric layer 1238 can be formed using similar material as dielectric layer 1218. Gate contacts 1246 can be formed by forming openings in dielectric layer 1238 using one or more etching processes and depositing a conductive material in the openings. In some embodiments, gate electrodes 1126 can also be etched during the formation of the openings. Source/drain contacts 1244 can be formed by etching dielectric layer 1238 and substrate 106 to form openings and depositing a conductive material in the openings. Silicide layers can be formed between source/drain contacts 1244 and lower epitaxial structures 602. For example, the deposition process of forming source/drain contacts 1244 can include depositing a metal layer followed by an anneal process to induce silicidation of the deposited metal layer. The conductive materials and the deposition processes for forming source/drain contacts 1244 and gate contacts 1246 can be similar to those for forming source/drain contacts 1204 and gate contacts 1206.

A planarization process can planarize the top surfaces of dielectric layer 1218, source/drain contacts 1204, and gate contacts 1206 such that the top surfaces are substantially coplanar. Another planarization process can be applied to the surfaces of dielectric layer 1238, source/drain contact 1244, and gate contacts 1246. In some embodiments, gate contacts 1206 can extend into gate electrodes 1116 and gate contacts 1246 can extend into gate electrodes 1126. In some embodiments, source/drain contacts 1204 can extend into upper epitaxial structures 802. Similarly, source/drain contacts 1204 and 1244 can also extend into upper epitaxial structures 802 and lower epitaxial structures 602, respectively. Silicide regions can be formed between source/drain contacts and the epitaxial structures for reducing contact resistance. Silicide regions are not illustrated in FIG. 10 for simplicity. Silicide regions can be formed of ruthenium silicide, nickel silicide, cobalt silicide, tungsten silicide, tantalum silicide, platinum silicide, erbium silicide, palladium silicide, any suitable silicide material, or combinations thereof.

Alternatively, source/drain contacts and gate contacts for both lower level semiconductor devices 920 and upper level semiconductor devices 940 can be formed on the front side of semiconductor device 200 (e.g., through a first portion of ILD layer 1118). For example, a first source/drain contact can be formed through ILD layer 1118 for electrically coupling to upper epitaxial structures 802. A second source/drain contact can be formed through a different portion of ILD layer 1118 for electrically coupling to lower epitaxial structures 602. The first and second portions of ILD layer 1118 are laterally separated (e.g., lateral offset). Similarly, gate contacts for lower level semiconductor devices 920 and upper level semiconductor devices 940 can be formed through ILD layer 1118. Source/drain contacts and gate contacts formed at the front side of semiconductor devices 200 are not illustrated in FIG. 10 are not illustrated for simplicity.

Back-end-of-line (BEOL) interconnect structures are formed over the source/drain contacts and the gate contacts on the front and back sides of semiconductor device 200. Additional dielectric layers 1222 and 1242 can be deposited on dielectric layers 1218 and 1238, respectively. BEOL interconnect structures can be formed in dielectric layers 1222 and 1242. Interconnects can be formed in dielectric layers 1222 and 1242. In some embodiments, the interconnects can be a network of electrical connections that include vias 1226 and 1266 extending vertically (e.g., along the z-axis) and wires 1228 and 1268 extending laterally (e.g., along the x-axis). Interconnect structures can provide electrical connections to source/drain contacts 1204 and 1244 as well as and gate contacts 1206 and 1246. In some embodiments, suitable passive and active semiconductor devices can be formed in dielectric layers 1218, 1222, 1238, and 1242 and are not illustrated for simplicity.

FIGS. 11-16 illustrate various stacked semiconductor devices, according to some embodiments. Reference numerals in FIGS. 11-16 generally indicate identical, functionally similar, and/or structurally similar elements.

Figure 11:
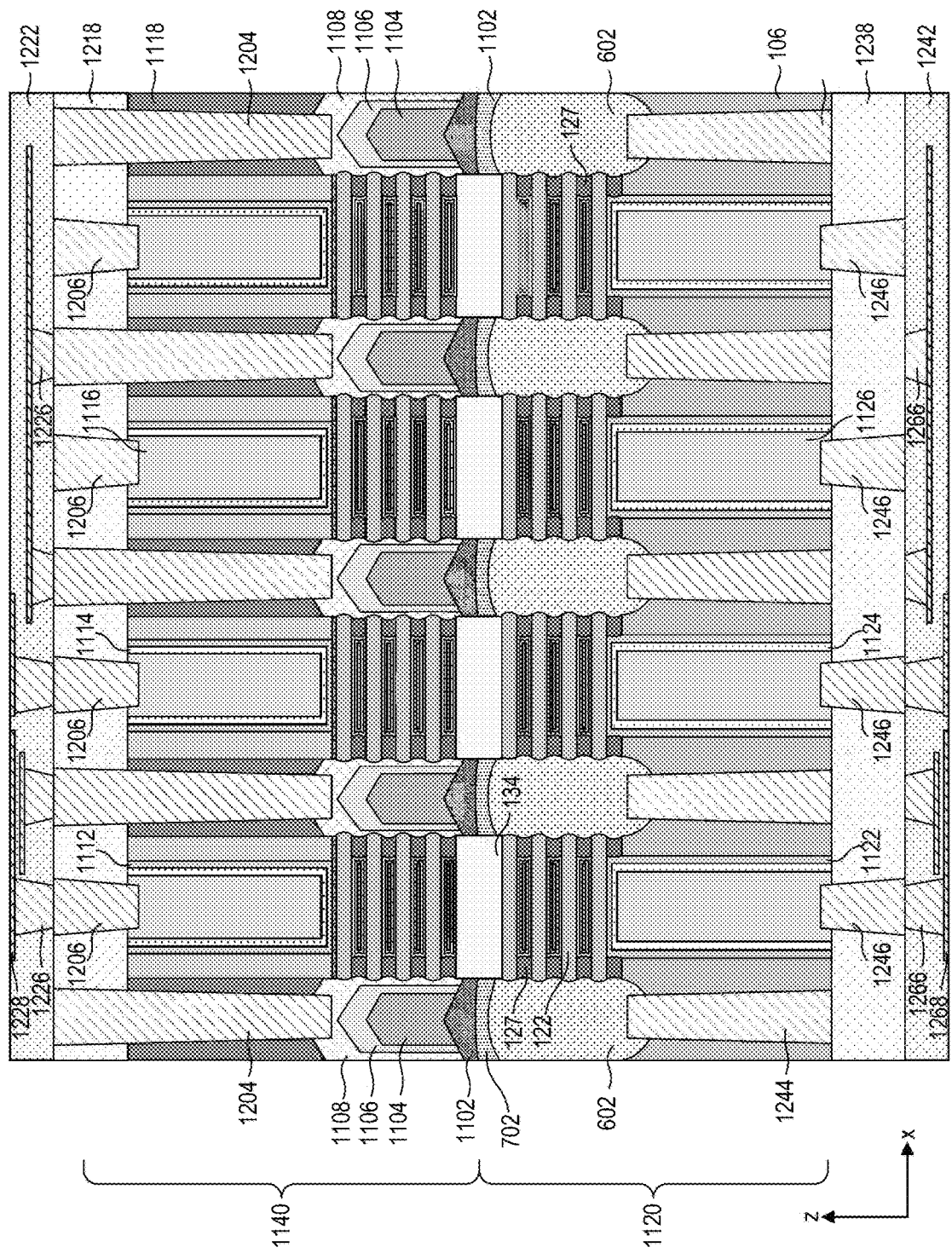
FIGS. 11-16 illustrate various stacked semiconductor devices having multi-layer epitaxial structures, in accordance with some embodiments.

FIG. 11 illustrates lower level semiconductor devices 1120 and upper level semiconductor devices 1140, according to some embodiments. The source/drain structures for upper level semiconductor devices 1140 can be formed by multiple epitaxial layers. Seed layer 1102 can be formed on isolation layer 702 and have a triangular-shaped top surface. The triangular-shaped top surface can increase contact surface between seed layer 1102 and subsequently formed source/drain structures. Multi-layer epitaxial structure can be formed on the seed layer 1102. For example, epitaxial layers 1104, 1106, and 1108 can be sequentially formed on seed layer 1102. The atomic concentrations of epitaxial layers 1104, 1106, and 1108 can gradually increase or decrease, depending on device design. For example, epitaxial layers 1104, 1106, and 1108 can be formed of silicon phosphide or silicon arsenide, and the phosphide or arsenide atomic concentrations can gradually increase from epitaxial layer 1104 to epitaxial layer 1108. In some embodiments, the phosphide or arsenide atomic concentrations can gradually decrease from epitaxial layer 1104 to epitaxial layer 1108. Top surfaces of epitaxial layers 1104, 1106, and 1108 can also have triangular-shaped top surfaces. Seed layer 1102 can be formed using material and deposition process similar to those of seed layer 702. In some embodiments, the deposition processes can be different. In some embodiments, epitaxial layers 1104, 1106, and 1108 can be formed using material and epitaxial growth processes similar to those of upper epitaxial structures 802.

Figure 12:
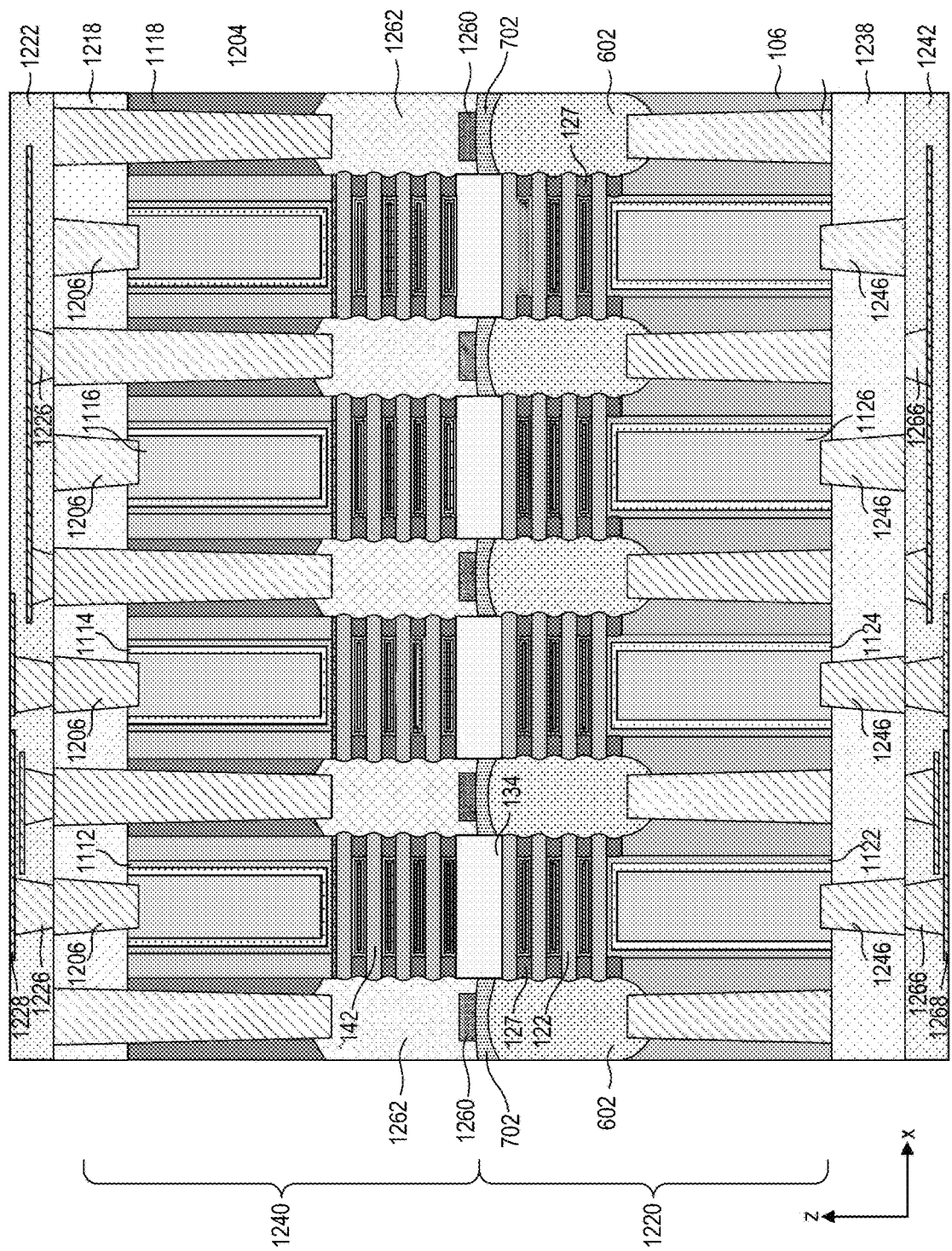

FIG. 12 illustrates lower level semiconductor devices 1220 and upper level semiconductor devices 1240, according to some embodiments. The source/drain structures for upper level semiconductor devices 1240 can be formed using a seed layer that has a width less than a width of the isolation layer. As shown in FIG. 12, seed layer 1260 has a width less than the width of isolation layer 702. In some embodiments, seed layer 1260 can be formed using a material similar to that of seed layer 704. In some embodiments, seed layer 1260 can be formed by blanket depositing a seed layer material and performing an etch back process such that the seed layer material remains at the top surface of isolation layer 702. The etch back process can also etch the seed layer material horizontally (e.g., in the x-direction) such that seed layer 1260 has a width less than isolation layer 702. Upper epitaxial structures 1262 can be formed from the top and side surfaces of seed layer 1260. A width of seed layer 1260 less than the width of isolation layer 702 can provide the benefit of increasing growth surface area and enabling lateral epitaxial growth which in turn reduce defects at the growth surface.

Figure 13:
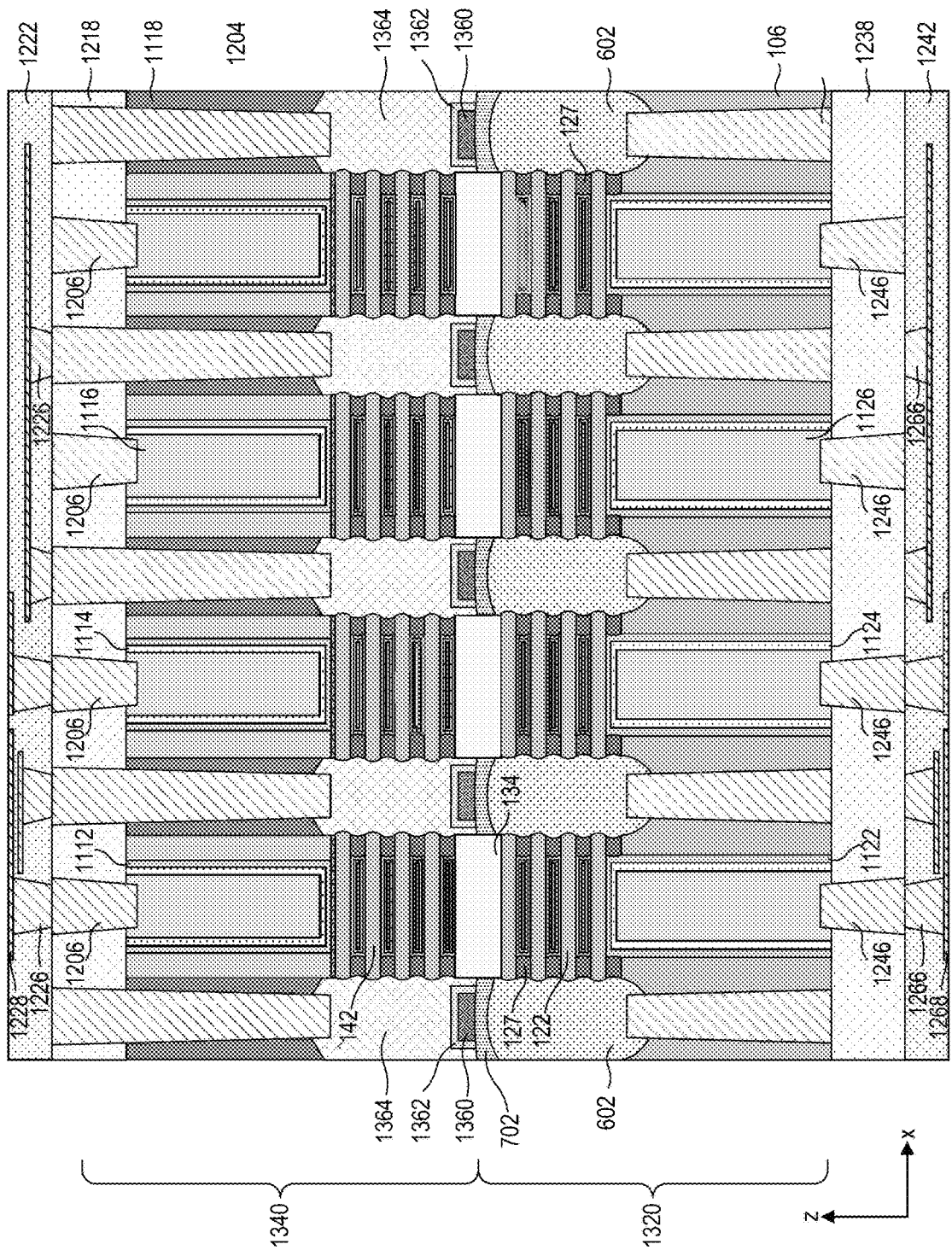

FIG. 13 illustrates lower level semiconductor devices 1320 and upper level semiconductor devices 1340, according to some embodiments. The source/drain structures for upper level semiconductor devices 1340 can be formed using a seed layer that has a width less than a width of the isolation layer. A multi-layer epitaxial structure can be formed using the seed layer. Seed layer 1360 can be similar to seed layer 1260 described in FIG. 12 and has a width less than the width of isolation layer 702. In some embodiments, seed layer 1360 can be formed using a material similar to that of seed layer 704. In some embodiments, seed layer 1360 can be formed using a similar deposition and etch back process used to form seed layer 1260. In some embodiments, an epitaxial layer 1362 can be deposited on the top surface and sidewall surfaces of seed layer 1360. Upper epitaxial structures 1364 can be deposited on the top surface and sidewall surfaces of epitaxial layer 1362. The atomic concentrations of epitaxial layer 1362 and upper epitaxial structures 1364 can gradually increase or decrease, depending on device design. For example, epitaxial layer 1362 and upper epitaxial structure 1364 can be formed of silicon phosphide or silicon arsenide, and the phosphide or arsenide atomic concentrations can gradually increase from epitaxial layer 1362 to upper epitaxial structure 1364. In some embodiments, the phosphide or arsenide atomic concentrations can gradually decrease from epitaxial layer 1362 to upper epitaxial structure 1364. An epitaxial layer 1362 formed between upper epitaxial structure 1364 and seed layer 1360 can provide the benefit of having a gradual or step increase/decrease in dopant concentration and further reduce defects.

Figure 14:
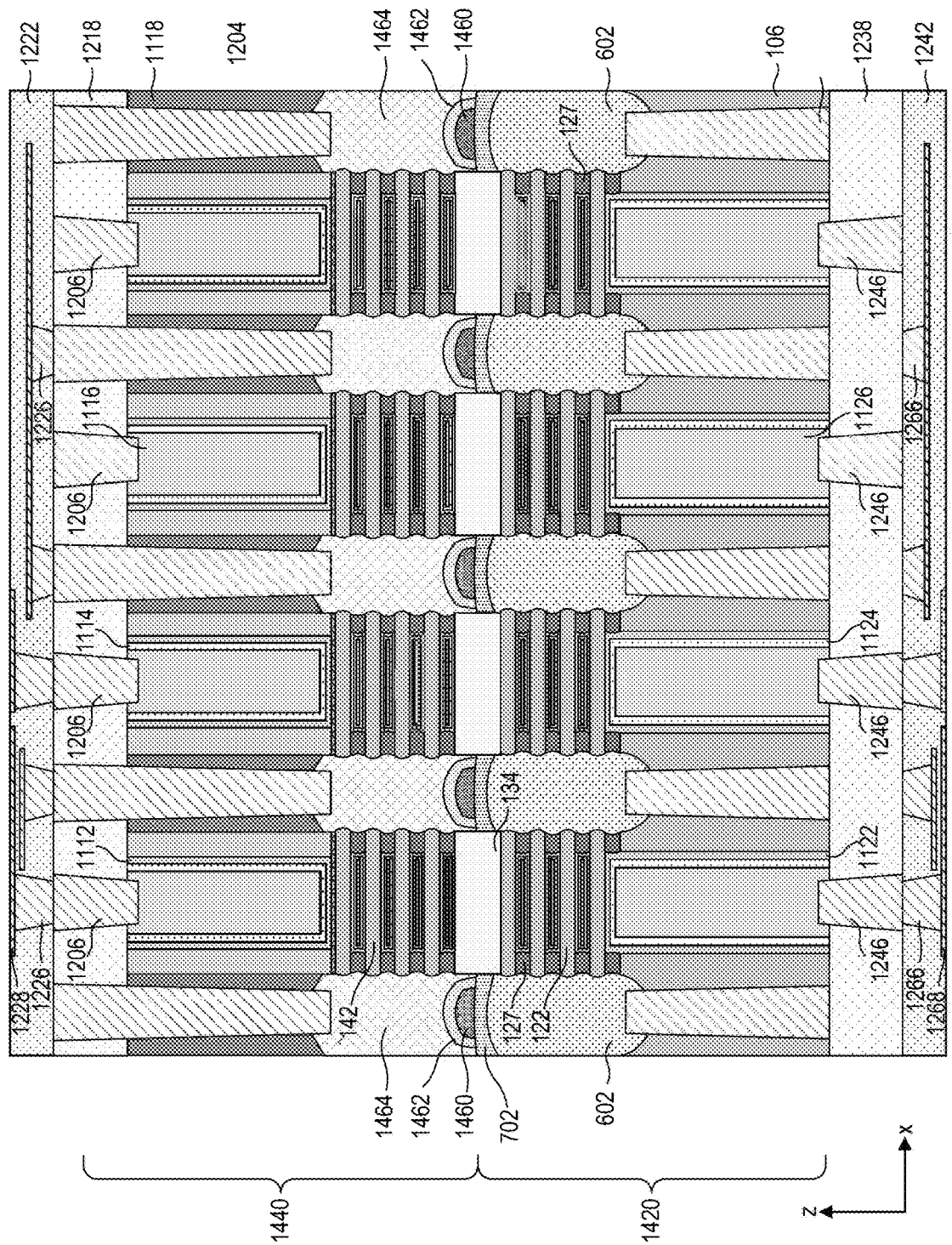

FIG. 14 illustrates lower level semiconductor devices 1420 and upper level semiconductor devices 1440, according to some embodiments. The source/drain structures for upper level semiconductor devices 1440 can be formed using a seed layer that has a width less than a width of the isolation layer and having a non-planar top surface. A multi-layer epitaxial structure can be formed using the seed layer. Seed layer 1460 can be similar to seed layer 1260 described in FIG. 12 and has a width less than the width of isolation layer 702. In some embodiments, seed layer 1460 can be formed using a material similar to that of seed layer 704. In some embodiments, seed layer 1460 can be formed using a deposition and etch back process. For example, the etch back process can be an isotropic etching process such that the exterior surfaces of seed layer 1460 can be non-planar (e.g., curved). In some embodiments, an epitaxial layer 1462 can be deposited on the exterior surface of seed layer 1460. Upper epitaxial structures 1464 can be deposited on the exterior surface of epitaxial layer 1462. The atomic concentrations of epitaxial layer 1462 and upper epitaxial structures 1464 can gradually increase or decrease, depending on device design. For example, epitaxial layer 1462 and upper epitaxial structure 1464 can be formed of silicon phosphide or silicon arsenide, and the phosphide or arsenide atomic concentrations can gradually increase from epitaxial layer 1462 to upper epitaxial structure 1464. In some embodiments, the phosphide or arsenide atomic concentrations can gradually decrease from epitaxial layer 1462 to upper epitaxial structure 1464. A seed layer with a non-planar exterior surface can provide the benefit of reducing voids forming at sharp corners during the epitaxial growth of epitaxial layer 1462. Epitaxial layer 1462 formed between upper epitaxial structure 1464 and seed layer 1460 can provide the benefit of having a gradual or step increase/decrease in dopant concentration and further reduce defects.

Figure 15:
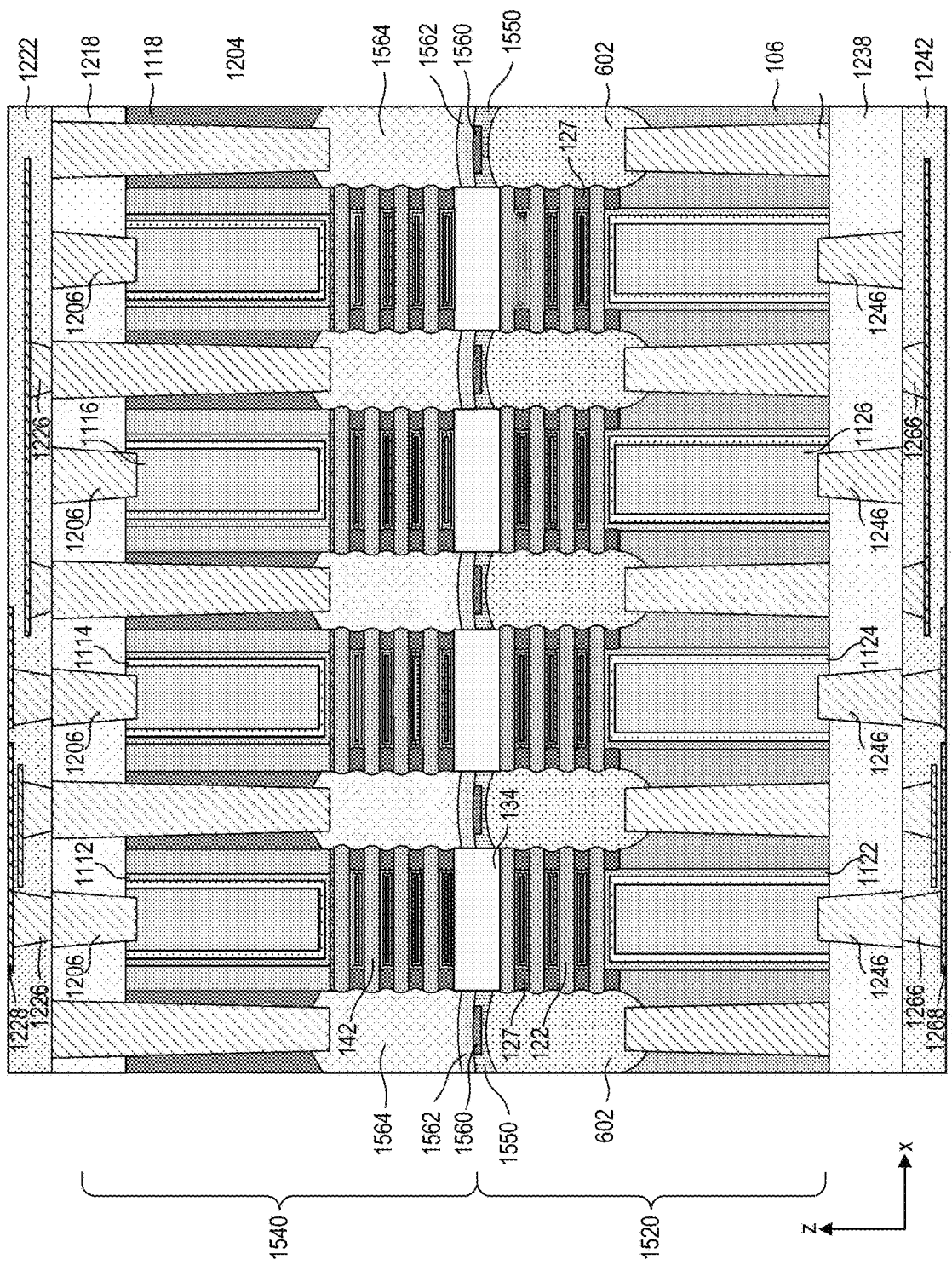

FIG. 15 illustrates lower level semiconductor devices 1520 and upper level semiconductor devices 1540, according to some embodiments. The source/drain structures for upper level semiconductor devices 1540 can be formed using seed layer 1560 that formed within isolation layer 1550. A multi-layer epitaxial structure can be formed using the seed layer. In some embodiments, isolation layer 1550 can be formed using a material similar to that of isolation layer 702. In some embodiments, isolation layer 1550 and seed layer 1560 can be formed by a blanket deposition process of isolation material followed by another blanket deposition process of seed layer material. After the blanket deposition, the isolation material include vertical portions that are formed on sidewalls of spacer 114, semiconductor layers 142, and inner spacers 127. The isolation material also includes a horizontal portion formed on the top surface of lower epitaxial structures 602. The seed layer material can be deposited on the horizontal portion and between the vertical portions of the isolation material. An etch back process can be applied to the deposited isolation material and seed layer material such that isolation layer 1550 and seed layer 1560 are formed. In some embodiments, seed layer 1560 can be formed using a material similar to that of seed layer 704. In some embodiments, an epitaxial layer 1562 can be deposited on the top surface of seed layer 1560. Upper epitaxial structures 1564 can be deposited on the top surface of epitaxial layer 1562. The atomic concentrations of epitaxial layer 1562 and upper epitaxial structures 1564 can gradually increase or decrease, depending on device design. For example, epitaxial layer 1562 and upper epitaxial structure 1564 can be formed of silicon phosphide or silicon arsenide, and the phosphide or arsenide atomic concentrations can gradually increase from epitaxial layer 1562 to upper epitaxial structure 1564. In some embodiments, the phosphide or arsenide atomic concentrations can gradually decrease from epitaxial layer 1562 to upper epitaxial structure 1564. A seed layer embedded within the isolation layer can provide the benefit of reducing voids forming at sharp corners during the epitaxial growth of epitaxial layer 1562.

Figure 16:
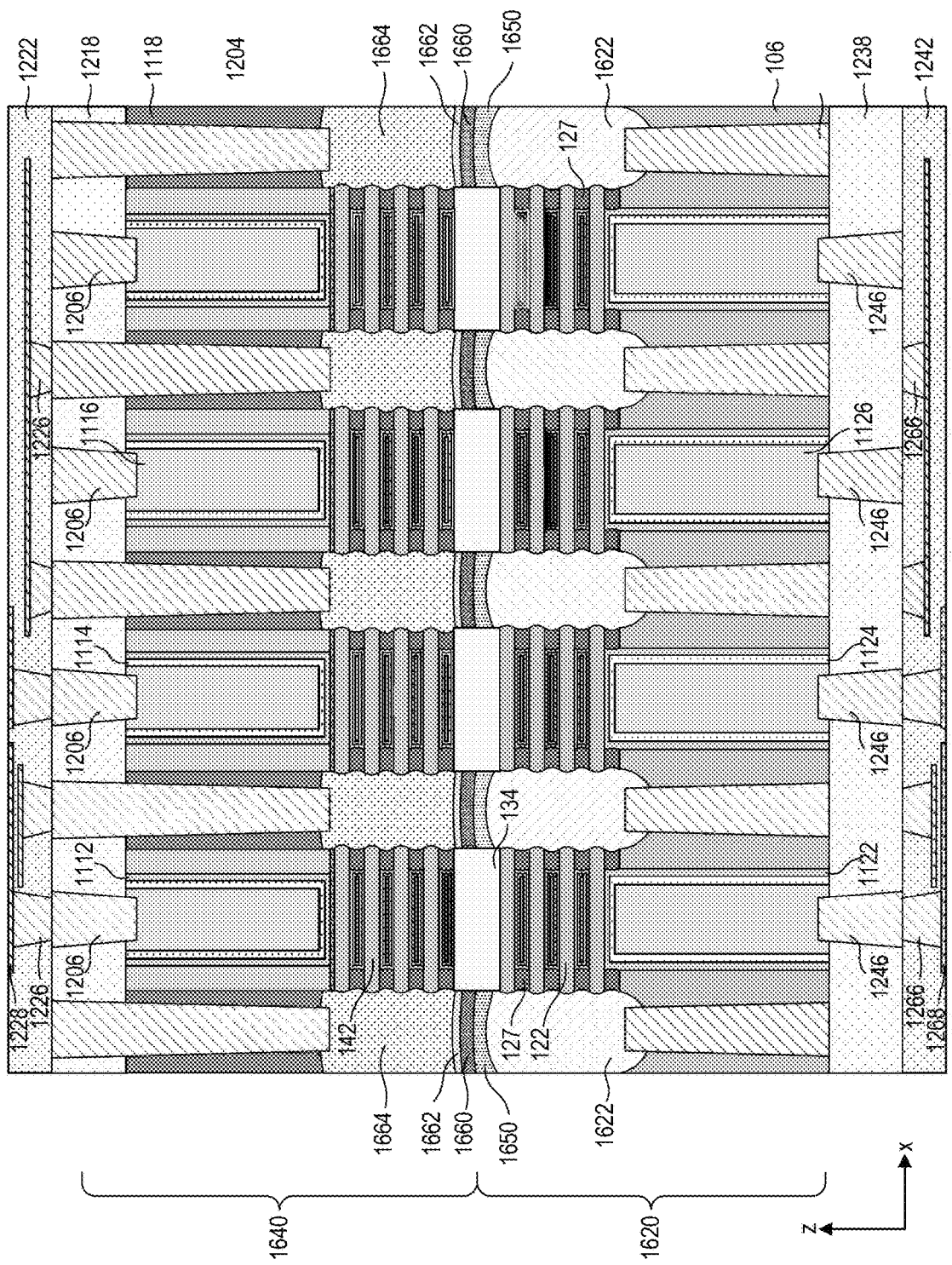

FIG. 16 illustrates lower level semiconductor devices 1620 and upper level semiconductor devices 1640, according to some embodiments. Lower level semiconductor devices 1620 can include NFET devices and upper level semiconductor devices can include PFET devices. Upper epitaxial structures 1664 for upper level semiconductor devices 1640 can be formed using a seed layer 1660 on isolation layer 1650 and a buffer layer 1662 formed on seed layer 1660. In some embodiments, upper epitaxial structure 1664 can be formed using a material similar to that of lower epitaxial structure 602 described in FIGS. 6-15. In some embodiments, buffer layer 1662 can be formed of a suitable semiconductor layer, such as a silicon germanium layer. In some embodiments, buffer layer 1662 can be optional. In some embodiments, buffer layer 1662 and upper epitaxial structure 1664 can be collectively referred to as a source/drain structure. Seed layer 1660 can be formed using a material similar to that of seed layer 704. In some embodiments, seed layer 1660 can be formed using a deposition and etch back process. In some embodiments, lower epitaxial structure 1622 can be formed using a material similar to that of upper epitaxial structure 802 described in FIGS. 8-10. The atomic concentrations of buffer layer 1662 and upper epitaxial structures 1664 can gradually increase or decrease, depending on device design. For example, epitaxial layer 1662 can be formed of silicon germanium and upper epitaxial structure 1664 can be formed of silicon germanium doped with boron, and the germanium atomic concentration can gradually increase from buffer layer 1662 to upper epitaxial structure 1664. In some embodiments, the germanium atomic concentration can gradually decrease from buffer layer 1662 to upper epitaxial structure 1664. In some embodiments, upper epitaxial structures 1664 can have a non-uniform atomic concentration of germanium that decreases or increases from a top surface to a bottom surface of its epitaxial body.

Various embodiments in the present disclosure describe methods for forming stacked semiconductor devices with reduced source/drain contact resistance and improved source/drain epitaxial quality. The stacked semiconductor devices can include an upper level semiconductor device stacked on top of a lower level semiconductor device. In some embodiments, a p-type FET device can be stacked over an n-type FET device. In some embodiments, an n-type FET device is stacked over a p-type FET device. Isolation structures are formed between the first and second types of semiconductor devices. A multi-layer epitaxial source/drain formation process for the upper level semiconductor device can include forming one or more seed layers on the isolation structure and performing an epitaxial growth. Stacked semiconductor devices described herein can provide increased device density and the multi-layer epitaxial source/drain structures can improve device performance, reliability, and yield.

In some embodiments, a semiconductor device includes a first transistor device of a first type. The first transistor includes first nanostructures, a first pair of source/drain structures, and a first gate electrode on the first nanostructures. The semiconductor device also includes a second transistor device of a second type formed over the first transistor device. The second transistor device includes second nanostructures over the first nanostructures, a second pair of source/drain structures over the first pair or source/drain structures, and a second gate electrode on the second nanostructures and over the first nanostructures. The semiconductor device also includes a first isolation structure between the first and second nanostructures. The semiconductor device further includes a second isolation structure in contact with a top surface of the first pair of source/drain structures. The semiconductor device also includes a seed layer between the second isolation structure and the second pair of source/drain structures.

In some embodiments, a semiconductor structure includes a first transistor device. The first transistor device includes first nanostructures and a first gate dielectric layer wrapping around each nanostructure of the first nanostructures. The first transistor device also includes a first gate electrode disposed on the first gate dielectric layer and on the first nanostructures. The first transistor device further includes a first source/drain region in contact with the first nanostructures. The first source/drain region includes a first bottom surface and a first top surface. The semiconductor structure also includes an isolation layer that includes a second bottom surface and a second top surface. The second bottom surface is in contact with the first top surface. The semiconductor structure also includes a seed layer having a third bottom surface and a third top surface. The third bottom surface is in contact with the second top surface. The semiconductor structure also includes a second transistor device. The second transistor device includes second nanostructures, a second gate dielectric layer, and a second gate electrode disposed on the second gate dielectric layer and on the second plurality of nanostructures. The second transistor device also includes a second source/drain region in contact with the second nanostructures. The second source/drain region includes a fourth bottom surface and a fourth top surface. The fourth bottom surface is in contact with the third top surface.

In some embodiments, a method includes forming first semiconductor layers on a substrate and forming a first isolation layer on the first semiconductor layers. The method also includes forming second semiconductor layers on the first semiconductor layers. The method further includes removing portions of the isolation layer and portions of the first and second semiconductor layers. Remaining portions of the first and second semiconductor layers form first and second nanostructures, respectively. The method further includes forming a first source/drain structure in contact with the first nanostructures and depositing a second isolation layer on the first source/drain structures. The method also includes depositing a seed layer on the second isolation layer and forming a second source/drain structure using the seed layer. The second source/drain structure is in contact with the second nanostructures.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first transistor device of a first type, comprising:
      a first plurality of nanostructures;
      a first pair of source/drain structures; and
      a first gate electrode on the first plurality of nanostructures;
   a second transistor device of a second type formed over the first transistor device, the second transistor device comprising:
      a second plurality of nanostructures over the first plurality of nanostructures;
      a second pair of source/drain structures over the first pair of source/drain structures; and
      a second gate electrode on the second plurality of nanostructures and over the first plurality of nanostructures;
   a first isolation structure between the first and second pluralities of nanostructures;
   a second isolation structure in contact with a top surface of the first pair of source/drain structures; and
   a seed layer between the second isolation structure and the second pair of source/drain structures.

2. The semiconductor device of claim 1, wherein the first transistor device comprises a p-type field effect transistor (PFET) and the second transistor device comprises an n-type field effect transistor (NFET).

3. The semiconductor device of claim 1, wherein the first transistor device comprises an n-type field effect transistor (NFET) and the second transistor device comprises a p-type field effect transistor (PFET).

4. The semiconductor device of claim 1, further comprising a plurality of inner spacers, wherein an inner spacer of the plurality of inner spacers is formed between adjacent nanostructures of the first plurality of nanostructures.

5. The semiconductor device of claim 1, wherein the first and second isolation structures are in contact with each other.

6. The semiconductor device of claim 1, wherein the seed layer and the first isolation structure are in contact with each other.

7. The semiconductor device of claim 1, wherein the second pair of source/drain structures comprises a buffer layer in contact with the seed layer.

8. The semiconductor device of claim 1, wherein the second pair of source/drain structures comprises a first epitaxial layer on the seed layer and a second epitaxial layer on the first epitaxial layer, and wherein a first atomic concentration of phosphorous or arsenic of the first epitaxial layer is different from a second atomic concentration of phosphorous or arsenic of the second epitaxial layer.

9. The semiconductor device of claim 1, wherein the second pair of source/drain structures comprises a first epitaxial layer on the seed layer and a second epitaxial layer on the first epitaxial layer, and a first atomic concentration of germanium of the first epitaxial layer is different from a second atomic concentration of germanium of the second epitaxial layer.

10. The semiconductor device of claim 1, wherein the second pair of source/drain structures comprises a non-uniform atomic concentration of germanium that decreases from a top surface of the second pair of source/drain structures to a bottom surface of the second pair of source/drain structures.

11. A semiconductor structure, comprising:
a first transistor device, comprising:
   a first plurality of nanostructures;
   a first gate dielectric layer wrapping around each nanostructure of the first plurality of nanostructures;
   a first gate electrode disposed on the first gate dielectric layer and on the first plurality of nanostructures; and
   a first source/drain region in contact with the first plurality of nanostructures, the first source/drain region comprising a first bottom surface and a first top surface;
   an isolation layer comprising a second bottom surface and a second top surface, wherein the second bottom surface is in contact with the first top surface;
   a seed layer comprising a third bottom surface and a third top surface, wherein the third bottom surface is in contact with the second top surface; and
a second transistor device, comprising:
   a second plurality of nanostructures;
   a second gate dielectric layer;
   a second gate electrode disposed on the second gate dielectric layer and on the second plurality of nanostructures; and
   a second source/drain region in contact with the second plurality of nanostructures, the second source/drain region comprising a fourth bottom surface and a fourth top surface, wherein the fourth bottom surface is in contact with the third top surface.

12. The semiconductor structure of claim 11, wherein the first transistor device comprises a p-type field effect transistor (PFET) and the second transistor device comprises an n-type field effect transistor (NFET).

13. The semiconductor structure of claim 11, wherein the first transistor device comprises an n-type field effect transistor (NFET) and the second transistor device comprises a p-type field effect transistor (PFET).

14. The semiconductor structure of claim 11, wherein the second source/drain region further comprises a buffer layer in contact with the third top surface.

15. The semiconductor structure of claim 11, further comprising a plurality of inner spacers, wherein a first inner spacer of the plurality of inner spacers is formed between adjacent nanostructures of the first plurality of nanostructures and a second inner spacer of the plurality of inner spacers is formed between adjacent nanostructures of the second plurality of nanostructures.

16. A structure, comprising:
a first plurality of nanostructures and a second plurality of nanostructures on a substrate;
a first isolation layer on the first plurality of nanostructures;
a first source/drain structure in contact with the first plurality of nanostructures;
a second isolation layer on the first source/drain structure;
a seed layer on the second isolation layer; and
a second source/drain structure on the seed layer, wherein the second source/drain structure is in contact with the second plurality of nanostructures.

17. The structure of claim 16, wherein the second source/drain structure comprises:
an epitaxial layer on a top surface and sidewall surfaces of the seed layer; and
an upper epitaxial layer on a top surface of the epitaxial layer.

18. The structure of claim 16, further comprising an interlayer dielectric (ILD) layer on the second source/drain structure.

19. The structure of claim 18, further comprising:
a plurality of upper gate structures on the second plurality of nanostructures and between portions of the ILD layer; and
a plurality of lower gate structures formed within the substrate and in contact with the first plurality of nanostructures.

20. The structure of claim 16, wherein:
the first source/drain structure comprises silicon phosphide or silicon arsenide; and
the second source/drain structure comprises boron doped silicon germanium.

* * * * *